United States Patent
Tanaka et al.

(10) Patent No.: US 11,658,093 B2
(45) Date of Patent: May 23, 2023

(54) SEMICONDUCTOR ELEMENT WITH ELECTRODE HAVING FIRST SECTION AND SECOND SECTIONS IN CONTACT WITH THE FIRST SECTION, AND SEMICONDUCTOR DEVICE

(71) Applicant: ROHM CO., LTD., Kyoto (JP)

(72) Inventors: Hirofumi Tanaka, Kyoto (JP); Yuto Nishiyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 62 days.

(21) Appl. No.: 17/252,582

(22) PCT Filed: Jun. 26, 2019

(86) PCT No.: PCT/JP2019/025316
§ 371 (c)(1),
(2) Date: Dec. 15, 2020

(87) PCT Pub. No.: WO2020/012958
PCT Pub. Date: Jan. 16, 2020

(65) Prior Publication Data
US 2021/0257274 A1    Aug. 19, 2021

(30) Foreign Application Priority Data

Jul. 12, 2018    (JP) .............................. JP2018-132202

(51) Int. Cl.
*H01L 23/373*  (2006.01)
*H01L 23/31*  (2006.01)
(Continued)

(52) U.S. Cl.
CPC .......... *H01L 23/3736* (2013.01); *H01L 23/31* (2013.01); *H01L 23/367* (2013.01);
(Continued)

(58) Field of Classification Search
CPC ... H01L 23/3736; H01L 23/31; H01L 23/367; H01L 23/53228; H01L 23/53242; H01L 23/53257; H01L 23/56
See application file for complete search history.

(56) References Cited

U.S. PATENT DOCUMENTS

| 2005/0173739 A1* | 8/2005 | Kusumoto | ............ H01L 29/812 257/280 |
| 2013/0241084 A1* | 9/2013 | Tanaka | ............ H01L 29/41741 257/784 |

(Continued)

FOREIGN PATENT DOCUMENTS

| JP | 2004-96061 A | 3/2004 |
| JP | 2015-142059 A | 8/2015 |

(Continued)

OTHER PUBLICATIONS

International Search Report issued in 2018-132202, dated Sep. 24, 2019 (2 pages).

(Continued)

*Primary Examiner* — Laura M Menz
*Assistant Examiner* — Candice Chan
(74) *Attorney, Agent, or Firm* — Hamre, Schumann, Mueller & Larson, P.C.

(57) ABSTRACT

A semiconductor element includes a main body and an obverse face electrode. The main body includes an obverse face that faces in a thickness direction. The obverse face electrode is electrically connected to the main body. The obverse face electrode includes a first section and a plurality of second sections. The first section is provided on the obverse face. The plurality of second sections are in contact with the first section, and spaced apart from each other in a direction perpendicular to the thickness direction. A total area of the plurality of second sections is smaller than an (Continued)

area of the first section including portions overlapping with the plurality of second sections, in a view along the thickness direction.

20 Claims, 28 Drawing Sheets

(51) Int. Cl.
  *H01L 23/367* (2006.01)
  *H01L 23/532* (2006.01)
  *H01L 23/00* (2006.01)

(52) U.S. Cl.
  CPC .. *H01L 23/53228* (2013.01); *H01L 23/53242* (2013.01); *H01L 23/53257* (2013.01); *H01L 23/562* (2013.01)

(56) References Cited

U.S. PATENT DOCUMENTS

| | | | |
|---|---|---|---|
| 2018/0053737 A1* | 2/2018 | Ogawa | H01L 24/03 |
| 2018/0151479 A1* | 5/2018 | Nishikizawa | H01L 23/49555 |

FOREIGN PATENT DOCUMENTS

| | | |
|---|---|---|
| JP | 2018-26511 A | 2/2018 |
| JP | 2018-37684 A | 3/2018 |
| JP | 2018-85480 A | 5/2018 |
| WO | 2012/073302 A1 | 6/2012 |

OTHER PUBLICATIONS

Office Action received in the corresponding Japanese Patent application, dated Nov. 8, 2022, and machine translation (10 pages).

\* cited by examiner

SEMICONDUCTOR ELEMENT WITH ELECTRODE HAVING FIRST SECTION AND SECOND SECTIONS IN CONTACT WITH THE FIRST SECTION, AND SEMICONDUCTOR DEVICE

TECHNICAL FIELD

The present disclosure relates to a semiconductor element including a switching circuit, and a semiconductor device including the semiconductor element.

BACKGROUND ART

Semiconductor elements including a switching circuit, such as a MOSFET and an IGBT, and semiconductor devices including the semiconductor element, are widely known. Patent Literature 1 discloses an example of the semiconductor device including a semiconductor element constituted of a MOSFET.

The semiconductor element mounted in the mentioned semiconductor device includes a main electrode provided on a surface that faces in a thickness direction, and to which source current is supplied, and a metal conductive member electrically connected to the main electrode. The area of the main electrode occupies the majority of the area of the semiconductor element, in a view in the thickness direction. The conductive member includes, for example, copper and invar (Fe—Ni alloy) formed on each other. The semiconductor device includes a plurality of copper wires connected to the conductive member. The conductive member and the plurality of copper wires have relatively high thermal conductivity. Accordingly, the copper wires can be connected to the conductive member, and the heat dissipation performance of the semiconductor element is improved, and therefore the on-resistance of the switching circuit provided in the semiconductor element can be reduced. In addition, the resistance of the switching circuit against a surge voltage can be improved.

However, the semiconductor element may be warped so as to recede in the thickness direction, during the manufacturing process. Presumably, such a phenomenon originates from a change in volume of the conductive member due to the temperature, because the conductive member is higher in thermal expansion coefficient, than silicon which is the predominant component of the semiconductor element. When the semiconductor element is warped as above, the bonding strength between the semiconductor element and a wiring member such as a die pad may be degraded, when the semiconductor element is mounted on the wiring member.

PRIOR ART DOCUMENT

Patent Literature

PATENT LITERATURE 1: JP-A-2015-142059

SUMMARY OF INVENTION

Problem to be Solved by the Invention

In view of the foregoing situation, the present disclosure provides a semiconductor element that presents improved heat dissipation performance, and can be prevented from being warped, while also providing a semiconductor device including such a semiconductor element.

Means for Solving the Problem

In a first aspect, the present disclosure provides a semiconductor element including: a main body with an obverse face facing in a thickness direction; and an obverse face electrode electrically connected to the main body. The obverse face electrode includes a first section provided on the obverse face, and a plurality of second sections located in contact with the first section and spaced apart from each other in a direction perpendicular to the thickness direction. A total area of the plurality of second sections is smaller than an area of the first section including portions overlapping with the plurality of second sections, in a view along the thickness direction.

In a second aspect, the present disclosure provides a semiconductor device including: a semiconductor element according to the first aspect of the present disclosure, where the semiconductor element further includes a reverse face electrode electrically connected to the main body. The semiconductor device further includes a die pad on which the semiconductor element is mounted, an electroconductive bonding layer interposed between the die pad and the reverse face electrode, a terminal spaced apart from the die pad, and a wire connected to one of the plurality of second sections of the obverse face electrode and to the terminal. A composition of the wire includes copper.

Other features and advantages of the present disclosure will become more apparent, through the detailed description given hereunder with reference to the accompanying drawings.

MODE FOR CARRYING OUT THE INVENTION

Figure 1:
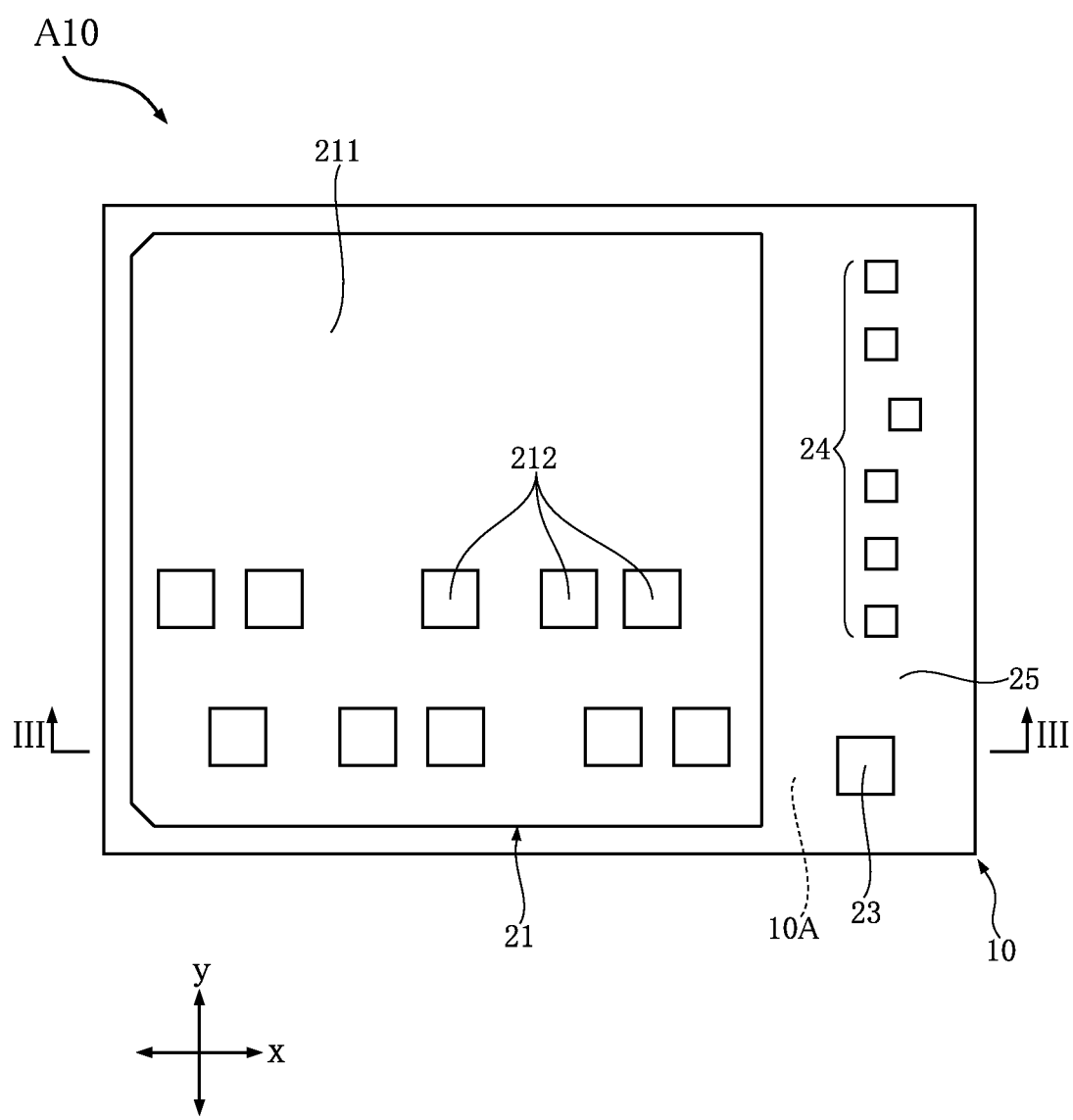
FIG. 1 is a plan view of a semiconductor element according to a first embodiment of the present disclosure.

Embodiments of the present disclosure will be described below with reference to the accompanying drawings.

First Embodiment

A semiconductor element A10 according to a first embodiment of the present disclosure, and a semiconductor device B10 including the semiconductor element A10, will be described hereunder, with reference to FIG. 1 to FIG. 29.
<Semiconductor Element A10>

Referring to FIG. 1 to FIG. 6, the semiconductor element A10 will be described. The semiconductor element A10 shown in these drawings includes a main body 10, an obverse face electrode 21, an underlying layer 29, a reverse face electrode 22, an input electrode 23, a plurality of test electrodes 24, and a surface cover film 25. In the illustrated example of the semiconductor element A10, a switching circuit 30, and a control circuit 40 electrically connected to the switching circuit 30, are formed on the main body 10. The switching circuit 30 may be, for example, a metal-oxide-semiconductor field-effect transistor (MOSFET) or an insulated gate bipolar transistor (IGBT). For the description of the semiconductor element A10, it will be assumed that the switching circuit 30 is a MOSFET of an n-channel type and a vertical type. The control circuit 40 detects a current running in the switching circuit 30 and a temperature of the switching circuit 30, to control the switching circuit 30 so as to normally operate. Thus, the semiconductor element A10 constitutes the essential part of an intelligent power device (IPD).

In the description of the semiconductor element A10, a thickness direction of the main body 10 will be referred to as "thickness direction z", for the sake of convenience. Likewise, a direction perpendicular to the thickness direction z will be referred to as "first direction x", and a direction perpendicular to both of the thickness direction z and the first direction x will be referred to as "second direction y".

Figure 3:
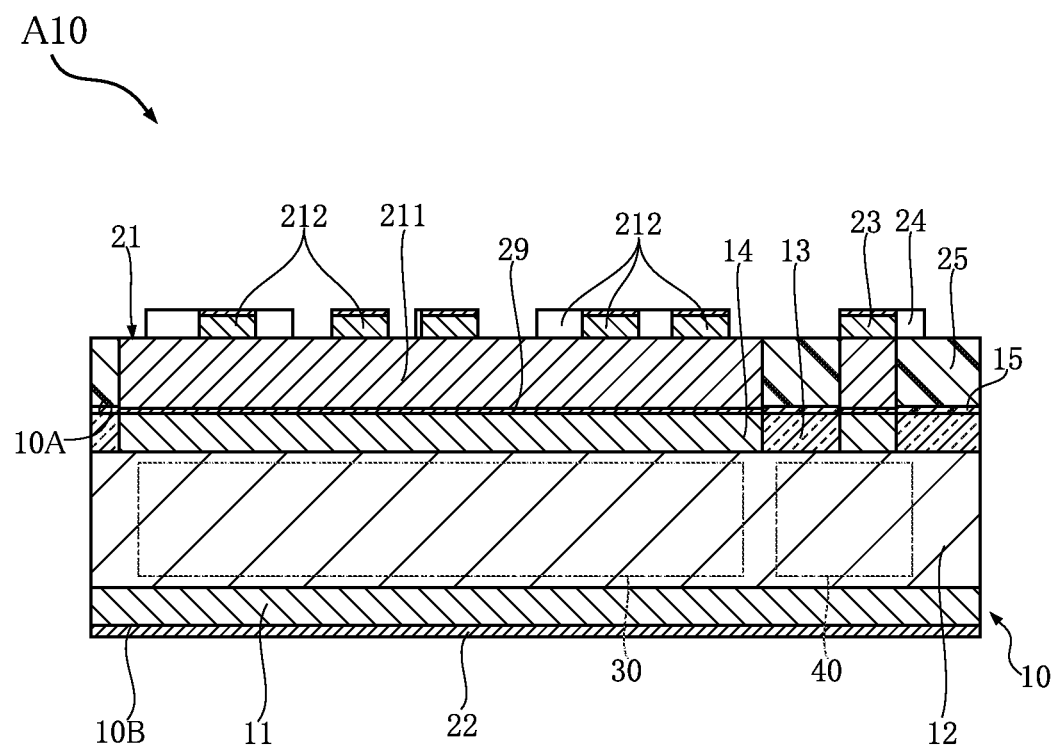
FIG. 3 is a cross-sectional view taken along a line III-III in FIG. 1.

The main body 10 has a rectangular shape as viewed along the thickness direction z, as shown in FIG. 1. The main body 10 includes an obverse face 10A and a reverse face 10B. The obverse face 10A is arranged to face in the thickness direction z. The reverse face 10B is arranged to face opposite the obverse face 10A. As shown in FIG. 3, the main body 10 includes a semiconductor substrate 11, an epitaxial layer 12, an interlayer dielectric film 13, an interconnect layer 14, and a passivation film 15.

As shown in FIG. 3, the semiconductor substrate 11 supports the epitaxial layer 12, the interlayer dielectric film 13, the interconnect layer 14, and the passivation film 15. The semiconductor substrate 11 is an n+ semiconductor layer. The semiconductor substrate 11 is, for example, formed of silicon (Si) or silicon carbide (SiC). A surface of the semiconductor substrate 11 located on the opposite side of the epitaxial layer 12 across the semiconductor substrate 11, in the thickness direction z, corresponds to the reverse face 10B of the main body 10.

As shown in FIG. 3, the epitaxial layer 12 is formed on the semiconductor substrate 11. The epitaxial layer 12 is an n-semiconductor layer. The switching circuit 30 and the control circuit 40 are formed on the epitaxial layer 12. The epitaxial layer 12 is electrically connected to the semiconductor substrate 11.

As shown in FIG. 3, the interlayer dielectric film 13 is formed on the epitaxial layer 12. The interlayer dielectric film 13 is formed of at least one of a silicon oxide ($SiO_2$) film and a silicon nitride ($Si_3N_4$) film. The interlayer dielectric film 13 may be formed, for example, by plasma chemical vapor deposition (CVD).

As shown in FIG. 3, the interconnect layer 14 is formed on a surface of the interlayer dielectric film 13 that faces in the same direction as the obverse face 10A in the thickness direction z, and inside the interlayer dielectric film 13. The interconnect layer 14 is electrically connected to the epitaxial layer 12. The interconnect layer 14 is formed of one or a plurality of metals selected from a metal group including, for example, aluminum (Al), copper (Cu), titanium (Ti), tungsten (W), and tantalum (Ta).

Figure 5:
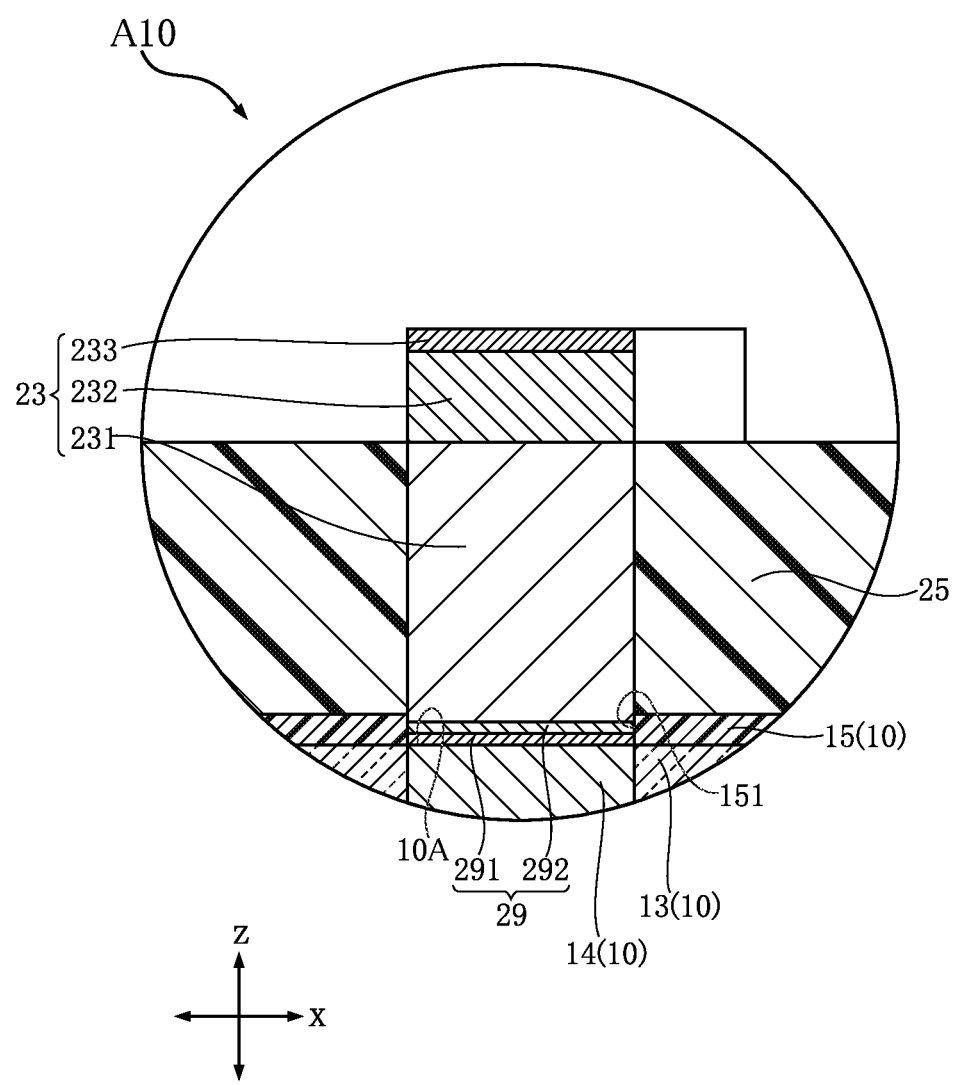
FIG. 5 is a partially enlarged cross-sectional view from FIG. 3.
Figure 7:
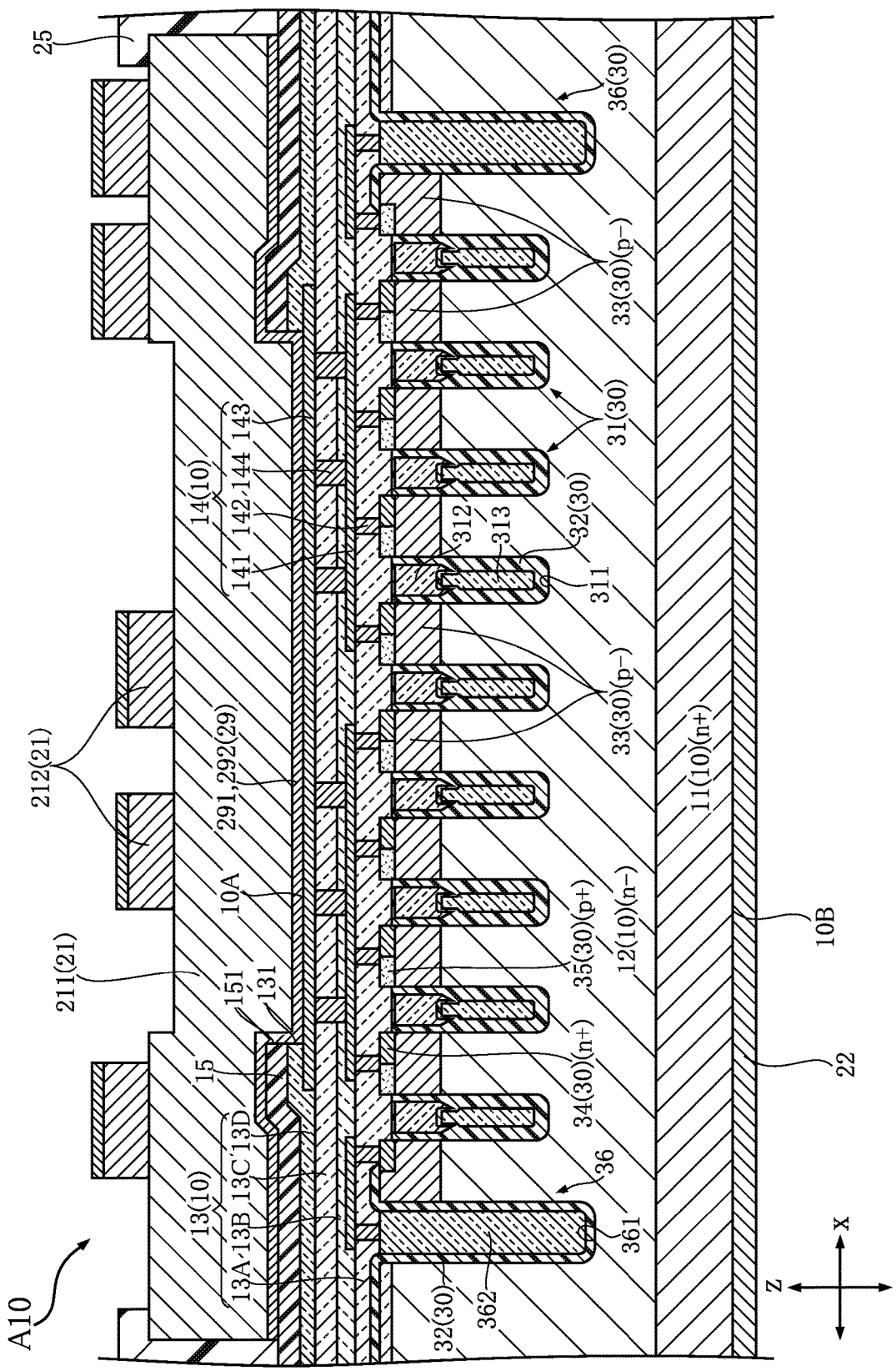
FIG. 7 is a partially enlarged cross-sectional view from FIG. 3.

As shown in FIG. 3, the passivation film 15 is formed on the interlayer dielectric film 13. The passivation film 15 is electrically insulative. The passivation film 15 is, for example, formed of a silicon oxide film formed on the interlayer dielectric film 13, and a silicon nitride film formed on the silicon oxide film. As shown in FIG. 5 and FIG. 7, the passivation film 15 includes a plurality of openings 151 penetrating therethrough in the thickness direction z. The plurality of openings 151 are spaced apart from each other, in a direction perpendicular to the thickness direction z. A part of the interconnect layer 14 is exposed from the opening 151. In the semiconductor element A10, a surface of the passivation film 15 that faces in the same direction as the obverse face 10A, in the thickness direction z, and a surface of the interconnect layer 14 exposed from the opening 151, correspond to the obverse face 10A of the main body 10.

The obverse face electrode 21 is, as shown in FIG. 7, located so as to cover one of the plurality of openings 151 having the largest area as viewed along the thickness direction z. The obverse face electrode 21 is electrically connected to both of the switching circuit 30 and the control circuit 40 formed on the epitaxial layer 12, via the underlying layer 29 and the interconnect layer 14. Accordingly, the obverse face electrode 21 is electrically connected to the main body 10. The obverse face electrode 21 includes a first section 211, and a plurality of second sections 212.

Figure 4:
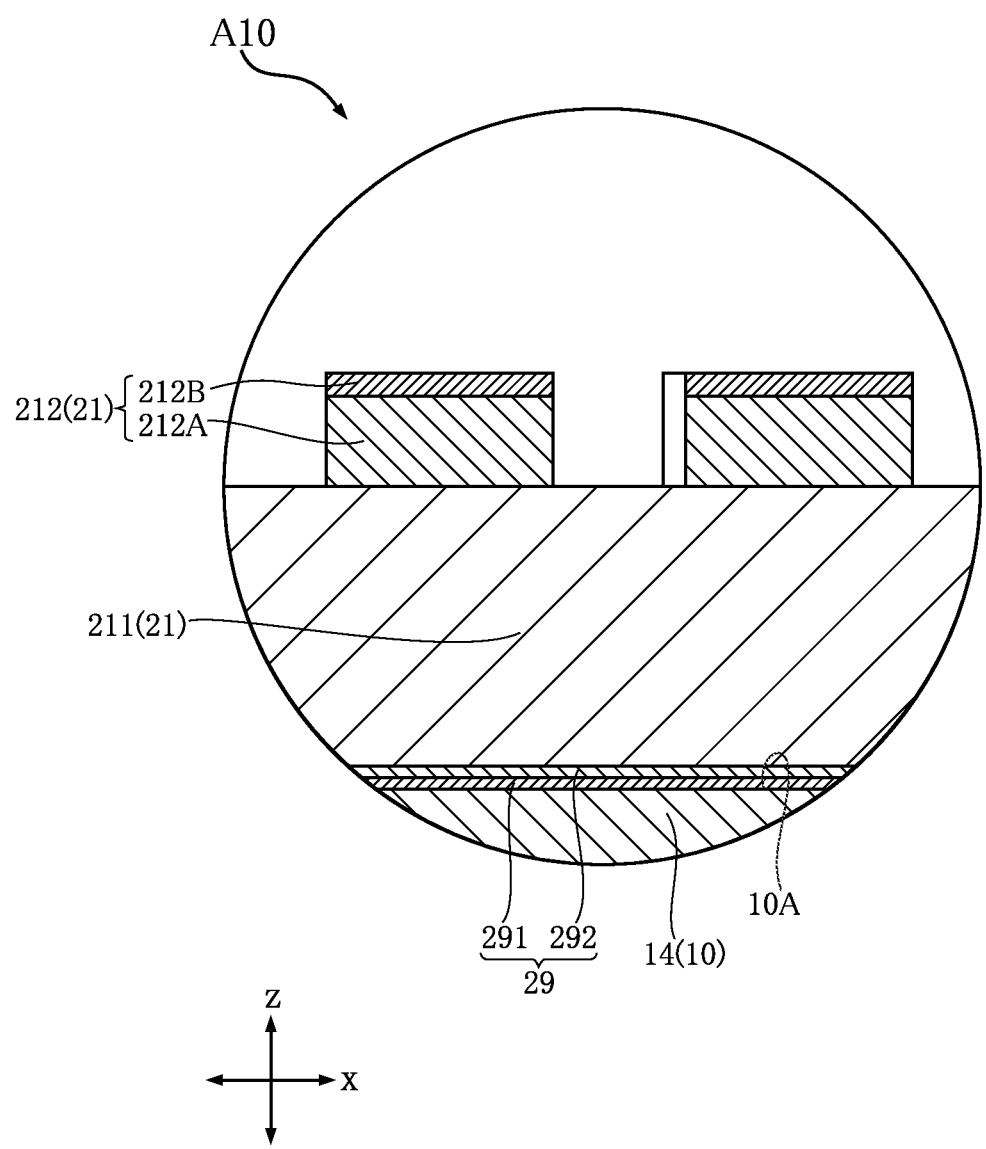
FIG. 4 is a partially enlarged cross-sectional view from FIG. 3.

As shown in FIG. 3 and FIG. 4, the first section 211 is provided on the obverse face 10A of the main body 10. In the semiconductor element A10, the first section 211 covers the obverse face 10A, via the underlying layer 29. As shown in FIG. 7, the first section 211 covers, via the underlying layer 29, a part of the passivation film 15 located adjacent to the opening 151. The composition of the first section 211 includes copper. In other words, the first section 211 may be formed exclusively of copper, or of an alloy containing copper. Preferably, the first section 211 may be formed of a metal having relatively high thermal conductivity. The first section 211 may have a thickness of not smaller than 8 μm and not greater than 12 μm.

As shown in FIG. 3, the plurality of second sections 212 are located in contact with the first section 211. The plurality of second sections 212 are spaced apart from each other, in the direction perpendicular to the thickness direction z. The plurality of second sections 212 each protrude from the first section 211, in the thickness direction z. In the semiconductor element A10, as shown in FIG. 4, the plurality of second sections 212 each include a first layer 212A and a second layer 212B.

As shown in FIG. 4, the first layer 212A is formed on the first section 211. The composition of the first layer 212A includes a metal element. The metal element may be nickel (Ni). The first layer 212A may have a thickness of not smaller than 1 μm and not greater than 5 μm. As viewed along the thickness direction z, the first layer 212A has a generally rectangular shape.

As shown in FIG. 4, the second layer 212B is formed on the first layer 212A. The composition of the second layer 212B includes a metal element. The metal element included in the composition of the second layer 212B is different from the metal element included in the composition of the first layer 212A. The composition of the second layer 212B includes palladium (Pd). The composition of the second layer 212B may include gold (Au), in place of palladium. The second layer 212B may have a thickness of not smaller than 0.1 μm and not greater than 0.3 μm. As viewed along the thickness direction z, the plurality of second layers 212B each have a generally rectangular shape. In the illustrated example of the semiconductor element A10, the plurality of second layers 212B each have a generally square shape, each side having a length of 0.15 mm, as viewed along the thickness direction z. Alternatively, the plurality of second layers 212B may each have a circular shape.

As shown in FIG. 1, as viewed along the thickness direction z, the total area of the plurality of second sections 212 is smaller than the area of the first section 211 including the portions overlapping with the plurality of second sections 212. In addition, as viewed along the thickness direction z, the ratio of the total area of the plurality of second sections 212, to the area of the first section 211 including the portions overlapping with the plurality of second sections 212, may be not smaller than 20% and not greater than 50%.

As viewed along the thickness direction z, the ratio of the area of the obverse face electrode 21 (area of the first section 211 including the portions overlapping with the plurality of second sections 212), to the area of the obverse face 10A of the main body 10, may be not less than 50%, and less than 90%. Preferably, the area of the obverse face electrode 21 may be equal to or larger than 1.0 mm².

The underlying layer 29 is, as shown in FIG. 3 and FIG. 4, interposed between the obverse face 10A of the main body 10 and the first section 211 of the obverse face electrode 21. Further, the underlying layer 29 is, as shown in FIG. 5, interposed between the obverse face 10A and a first layer 231 (to be subsequently described in detail) of the input electrode 23. The underlying layer 29 includes a barrier layer 291 and a seed layer 292. The barrier layer 291 is in contact with the obverse face 10A. The barrier layer 291 is formed of titanium. The seed layer 292 is interposed between the barrier layer 291, and the first section 211 and the first layer 231. The composition of the seed layer 292 is the same as that of the first section 211. Accordingly, the composition of the seed layer 292 includes copper.

Figure 6:
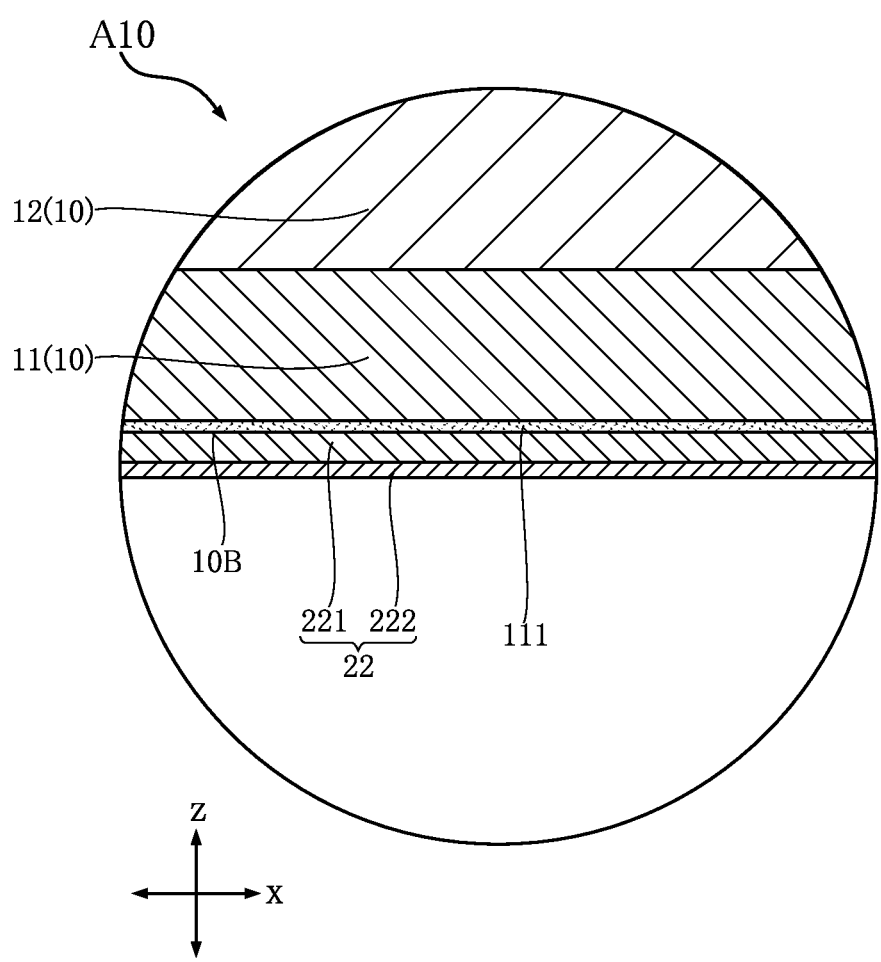
FIG. 6 is a partially enlarged cross-sectional view from FIG. 3.

The reverse face electrode 22 is, as shown in FIG. 3, provided on the reverse face 10B of the main body 10. The reverse face electrode 22 is provided over the entirety of the reverse face 10B. The reverse face electrode 22 is electrically connected to the epitaxial layer 12, via the semiconductor substrate 11. Therefore, the reverse face electrode 22 is electrically connected to the main body 10. As shown in FIG. 6, the reverse face electrode 22 includes a first layer 221 and a second layer 222. The first layer 221 is in contact with the reverse face 10B. The composition of the first layer 221 includes silver (Ag). The second layer 222 is formed on the first layer 221. The composition of the second layer 222 includes gold.

As shown in FIG. 6, a silicide layer 111 is formed on the semiconductor substrate 11 of the main body 10. The silicide layer 111 includes the reverse face 10B of the main body 10. The silicide layer 111 is in contact with the reverse face electrode 22. The composition of the silicide layer 111 includes silicon, and a metal element other than silicon. In the semiconductor element A10, the composition of the silicide layer 111 includes silicon and nickel.

The input electrode 23 is, as shown in FIG. 3 and FIG. 5, located in contact with the underlying layer 29, and on the obverse face 10A of the main body 10. The input electrode 23 is located so as to cover one of the plurality of openings 151, spaced apart from the opening 151 covered with the obverse face electrode 21. The input electrode 23 is electrically connected to the control circuit 40 formed on the epitaxial layer 12, via the underlying layer 29 and the interconnect layer 14. The input electrode 23 includes a first layer 231, a second layer 232, and a third layer 233. As viewed along the thickness direction z, the input electrode 23 has a generally rectangular shape.

As shown in FIG. 5, the first layer 231 is formed on the underlying layer 29. The composition and thickness of the first layer 231 are the same as those of the first section 211 (obverse face electrode 21). The second layer 232 is formed on the first layer 231. The composition and thickness of the second layer 232 are the same as those of the first layer 212A of the second section 212 (obverse face electrode 21). The third layer 233 is formed on the second layer 232. The composition and thickness of the third layer 233 are the same as those of the second layer 212B of the second section 212. As viewed along the thickness direction z, the first layer 231, the second layer 232, and the third layer 233 all have the same shape.

The plurality of test electrodes 24 are provided on the obverse face 10A of the main body 10, as shown in FIG. 1. The plurality of test electrodes 24 each have the same cross-sectional structure as that of the input electrode 23 shown in FIG. 5. The plurality of test electrodes 24 are, like the input electrode 23, electrically connected to the control circuit 40 formed on the epitaxial layer 12, via the underlying layer 29 and the interconnect layer 14. The plurality of test electrodes 24 are provided for the purpose of confirming the electrically continuity of the control circuit 40, during the manufacturing process of the semiconductor element A10.

The surface cover film 25 covers, as shown in FIG. 3, the surface of the passivation film 15 (part of the surface of the obverse face 10A of the main body 10). The surface cover film 25 covers the side face of the first section 211 of the obverse face electrode 21, the side face of the input electrode 23, and a part of the side face of each of the plurality of test electrodes 24. The surface cover film 25 is electrically insulative. The surface cover film 25 is, for example, formed of a material including polyimide.

Figure 8:
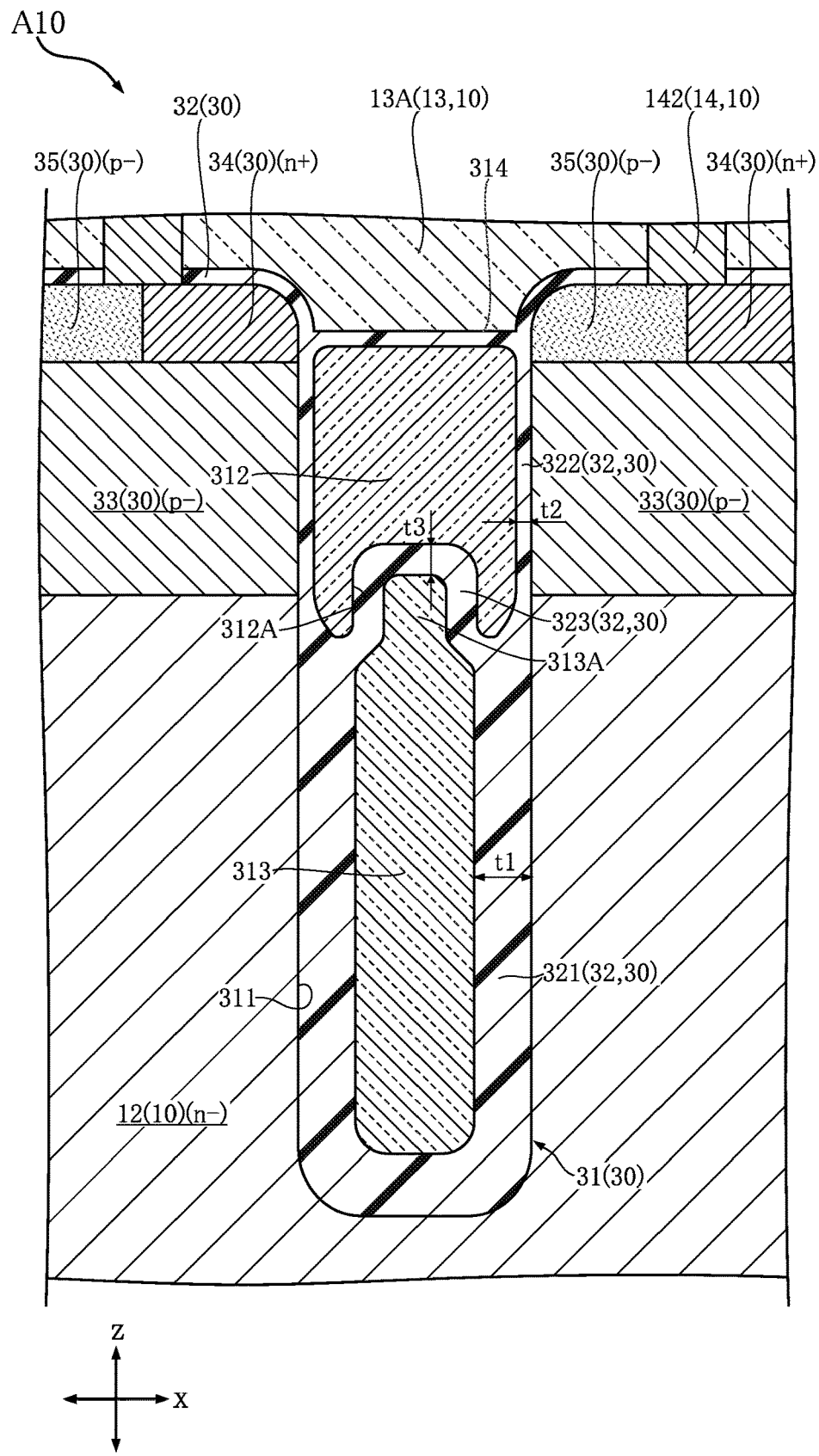
FIG. 8 is a partially enlarged cross-sectional view from FIG. 6.
Figure 9:
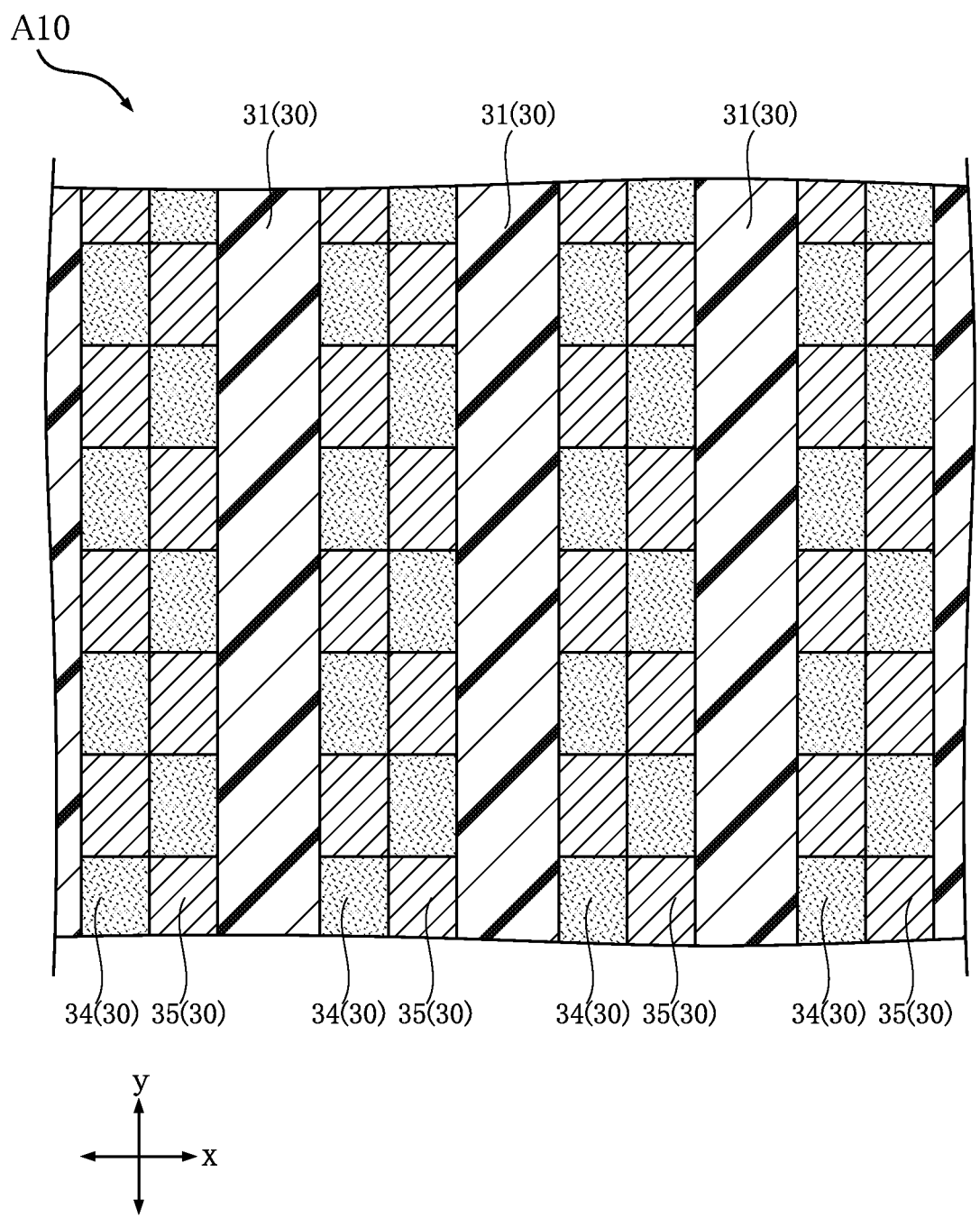
FIG. 9 is a partially enlarged plan view of a switching circuit formed on the main body of the semiconductor element shown in FIG. 1.

Referring now to FIG. 7 to FIG. 9, the switching circuit 30 formed on the epitaxial layer 12 of the main body 10 will be described hereunder. The switching circuit 30 includes a plurality of trench gate structures 31, a gate insulation layer 32, a plurality of body regions 33, a plurality of source regions 34, a plurality of body contact regions 35, and a DTI structure 36. Out of those, the plurality of body regions 33, the plurality of source regions 34, and the plurality of body contact regions 35 are formed by substituting the superficial portion of the epitaxial layer 12, and therefore semiconductor layers different from the epitaxial layer 12. The epitaxial layer 12 constitute the drain region of the switching circuit 30, together with the semiconductor substrate 11. As part of the description of the switching circuit 30, the interlayer dielectric film 13 and the interconnect layer 14 of the main body 10 will be described in further detail hereunder.

As shown in FIG. 7 and FIG. 8, the plurality of trench gate structures 31 each extend toward the semiconductor substrate 11, from the interface between the plurality of body regions 33, and the plurality of source regions 34 and the plurality of body contact regions 35, in the thickness direction z. The plurality of trench gate structures 31 are aligned in the first direction x at regular intervals, and extend in the second direction y. The plurality of trench gate structures 31 each include a first trench 311, a gate electrode 312, and a buried electrode 313.

As shown in FIG. 8, the first trench 311 is formed as a groove dug toward the semiconductor substrate 11, from the interface between the plurality of body regions 33, and the plurality of source regions 34 and the plurality of body contact regions 35, in the thickness direction z. The gate electrode 312 and the buried electrode 313 are accommodated in the first trench 311, spaced apart from each other in the thickness direction z. The buried electrode 313 is located closer to the semiconductor substrate 11 in the thickness direction z, with respect to the gate electrode 312. The gate electrode 312 and the buried electrode 313 are, for example, formed of polycrystalline polysilicon. The gate electrode 312 and the buried electrode 313 extend in the second direction y.

As shown in FIG. 8, the gate electrode 312 includes a recess 312A receding in the direction away from the buried electrode 313, in the thickness direction z. The recess 312A extends in the second direction y. The buried electrode 313 includes an upper end portion 313A opposed to the recess 312A. The upper end portion 313A is smaller in size in the first direction x, than a portion of the buried electrode 313 other than the upper end portion 313A. The upper end portion 313A is located inside the recess 312A.

As shown in FIG. 8, the gate insulation layer 32 is buried in the plurality of first trenches 311. Accordingly, the gate electrode 312 and the buried electrode 313 are covered with the gate insulation layer 32. The gate insulation layer 32 is, for example, formed of silicon oxide. The gate electrode 312 and the buried electrode 313 are electrically insulated from each other, by the gate insulation layer 32. Therefore, the gate electrode 312 and the buried electrode 313 are electrically insulated from outside of the trench gate structure 31. The gate insulation layers 32 buried in the respective first trenches 311 each include a thick wall portion 321, a thin wall portion 322, and an intermediate portion 323.

As shown in FIG. 8, the thick wall portion 321 covers the portion of the buried electrode 313 other than the upper end portion 313A. The thick wall portion 321 is in contact with the epitaxial layer 12. The thin wall portion 322 covers a portion of the gate electrode 312 other than the recess 312A. A thickness t2 of the thin wall portion 322 in the first direction x is thinner than a thickness t1 of the thick wall portion 321 in the first direction x ($t2<t1$). The intermediate portion 323 is located between the recess 312A of the gate electrode 312, and the upper end portion 313A of the buried electrode 313. A thickness t3 of the intermediate portion 323 in the thickness direction z is thinner than the thickness t1 of the thick wall portion 321, and thicker than the thickness t2 of the thin wall portion 322 ($t2<t3<t1$). The thickness t3 of the intermediate portion 323 may be equal to the thickness t2 of the thin wall portion 322.

As shown in FIG. 8, in the illustrated example of the semiconductor element A10, the first trench 311 extends in a uniform cross-sectional shape, in the thickness direction z. Alternatively, the first trench 311 may have a tapered shape such that the size of the first trench 311 in the first direction x gradually becomes smaller toward the semiconductor substrate 11, as viewed in the second direction y.

The plurality of body regions 33 are, as shown in FIG. 7 and FIG. 8, formed on the epitaxial layer 12. The plurality of body regions 33 are p− semiconductor layers. The plurality of body regions 33 each extend in the second direction y. The plurality of body regions 33 (except each of a pair of body regions 33 located at the respective ends of the plurality of body regions 33, in the first direction x) are each interposed between two of the trench gate structures 31 adjacent thereto in the first direction x, out of the plurality of trench gate structures 31. One of the plurality of body regions 33 interposed between the two trench gate structures 31 is in contact with the thin wall portion 322 of the gate insulation layer 32, buried in each of the two trench gate structure 31.

The plurality of source regions 34, and the plurality of body contact regions 35 are, as shown in FIG. 7 and FIG. 8, formed on the plurality of body regions 33. The plurality of source regions 34 are n+ semiconductor layers. The plurality of body contact regions 35 are p+ semiconductor layers. In each of the plurality of trench gate structures 31, as viewed along a given cross-section taken in a direction perpendicular to the second direction y, one of the plurality of source regions 34 is located adjacent to one side of the trench gate structure 31, in the first direction x. Likewise, one of the plurality of body contact regions 35 is located adjacent to the other side of the trench gate structure 31, in the first direction x. As shown in FIG. 9, as viewed along the thickness direction z, the plurality of source regions 34 and the plurality of body contact regions 35 are in contact with each other in the first direction x, in the region between two trench gate structures 31 adjacent to each other, out of the plurality of trench gate structures 31. Further, the plurality of source regions 34 and the plurality of body contact regions 35 are alternately located and in contact with each other, in the mentioned region. Accordingly, as viewed along the thickness direction z, the plurality of source regions 34 and the plurality of body contact regions 35 form a checkerboard pattern in the mentioned region. The plurality of source regions 34 and the plurality of body contact regions 35 are covered with the gate insulation layer 32. The plurality of body contact regions 35 may be substituted with the plurality of body regions 33, which are p-type semiconductor layers.

Figure 2:
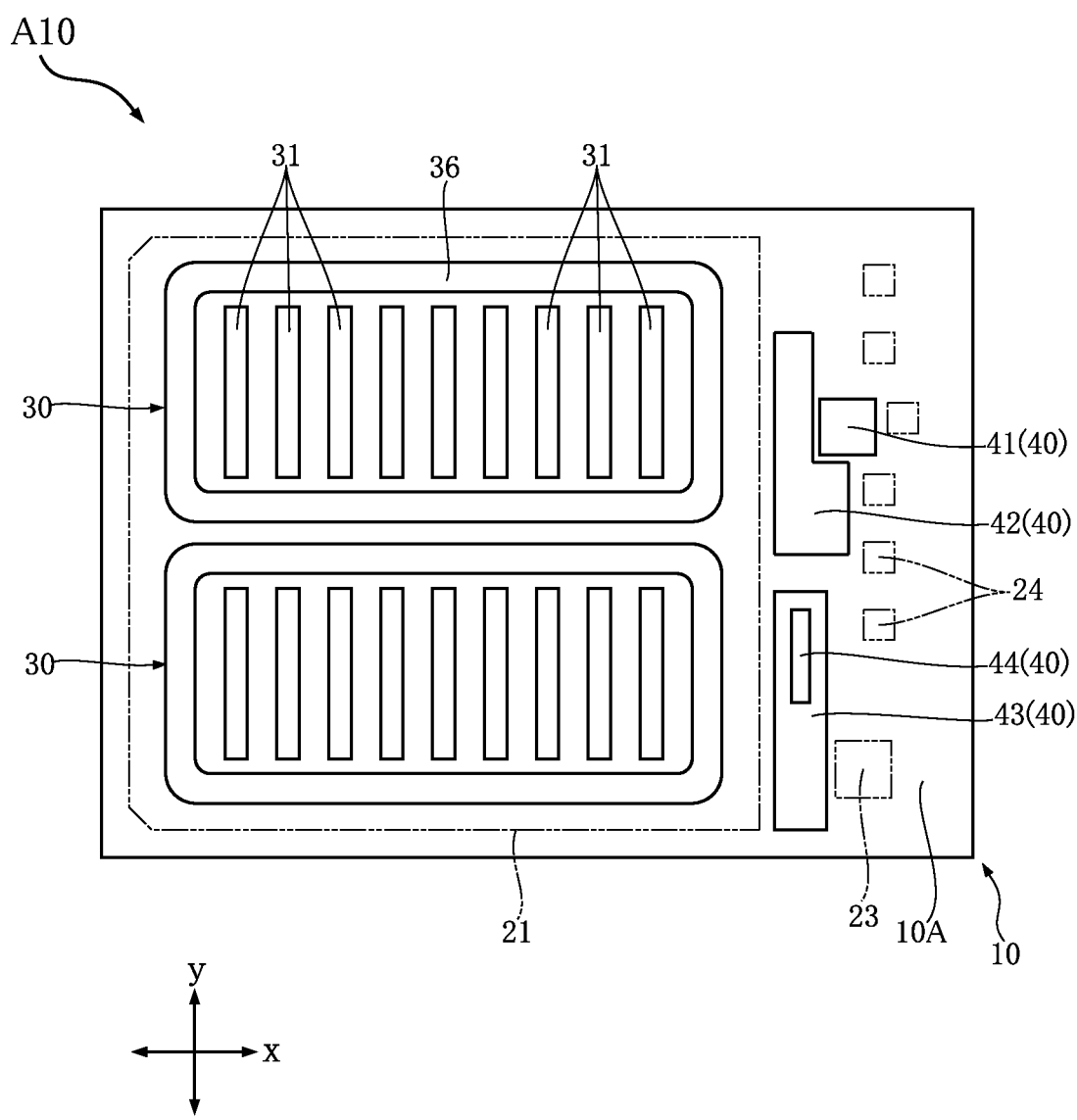
FIG. 2 is a plan view showing a layout of the semiconductor element shown in FIG. 1.

The deep trench isolation (DTI) structure 36 extends, as shown in FIG. 7, toward the semiconductor substrate 11, from the interface between the epitaxial layer 12 and the interlayer dielectric film 13 in the thickness direction z. The bottom portion of the DTI structure 36 is located closer to the semiconductor substrate 11, than the plurality of trench gate structures 31 are. As shown in FIG. 2, as viewed along the thickness direction z, the DTI structure 36 is formed in a frame shape extending around the periphery of the plurality of trench gate structures 31. Thus, the switching circuit 30 is isolated from the control circuit 40, by the DTI structure 36. Further, in the illustrated example of the semiconductor element A10, the switching circuit 30 is divided into two regions, by the DTI structure 36. The DTI structure 36 includes a second trench 361 and an insulative body 362.

As shown in FIG. 7, the second trench 361 is formed as a groove dug toward the semiconductor substrate 11, from the interface between the epitaxial layer 12 and the interlayer dielectric film 13 in the thickness direction z. The insulative body 362 is accommodated in the second trench 361. The insulative body 362 is, for example, formed of polycrystalline polysilicon, or silicon oxide. The gate insulation layer 32 is buried in the second trench 361. The insulative body 362 is covered with the gate insulation layer 32. Although the DTI structure 36 is employed to divide the switching circuit 30, in the illustrated example of the semiconductor element A10, a p-type diffusion region, formed by substituting a part of the epitaxial layer 12, may be employed for the same purpose.

The interlayer dielectric film 13 includes, as shown in FIG. 7, a first film 13A, a second film 13B, a third film 13C, and a fourth film 13D. The first film 13A is formed on the gate insulation layer 32. As shown in FIG. 8, the plurality of trench gate structures 31 each include a concave groove 314, formed from a stepped portion in the thickness direction z, between the gate electrode 312, and the plurality of source regions 34 and the plurality of body contact regions 35. The first film 13A is located inside the plurality of concave grooves 314. The second film 13B is formed on the first film 13A. The third film 13C is formed on the second film 13B. The fourth film 13D is formed on the third film 13C. The fourth film 13D includes a plurality of openings 131 penetrating therethrough in the thickness direction z. The position and size of the plurality of openings 131 correspond to those of the plurality of openings 151 of the passivation film 15. Accordingly, the plurality of openings 131 are continuous with the respective openings 151.

The interconnect layer 14 includes, as shown in FIG. 7, a first interconnect layer 141, a plurality of first vias 142, a second interconnect layer 143, and a plurality of second vias 144. The first interconnect layer 141 is formed on the first film 13A, and covered with the second film 13B. The plurality of first vias 142 are buried in the first film 13A. The plurality of first vias 142 are connected to the first interconnect layer 141, the plurality of source regions 34, and the plurality of body contact regions 35. The second interconnect layer 143 is formed on the third film 13C. The peripheral edge of the second interconnect layer 143 is covered with the fourth film 13D. The portion of the second interconnect layer 143 not covered with the fourth film 13D is exposed from both of the opening 131 formed in the fourth film 13D and the opening 151 formed in the passivation film 15, and such exposed portion is covered with the underlying layer 29. The plurality of second vias 144 are buried in the second film 13B and the third film 13C. The plurality of second vias 144 are connected to the first interconnect layer 141 and the second interconnect layer 143.

Figure 10:
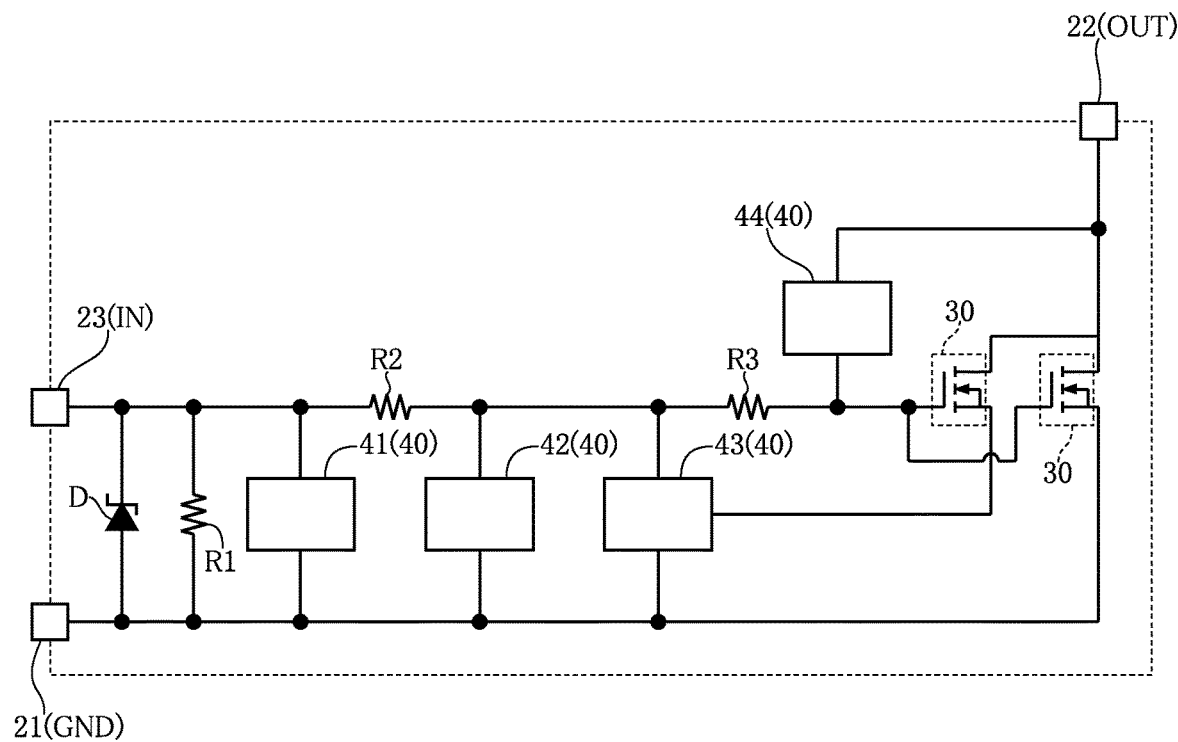
FIG. 10 is a circuit block diagram of the semiconductor element shown in FIG. 1.

Referring now to FIG. 10, a circuit configuration of the switching circuit 30 and the control circuit 40, formed on the epitaxial layer 12 of the main body 10, will be described hereunder.

As described above, the switching circuit 30 is divided into two regions by the DTI structure 36, in the illustrated example of the semiconductor element A10. Accordingly, the switching circuit 30 includes two MOSFETs. These MOSFETs are connected in parallel, in the conduction path between the reverse face electrode 22 and the obverse face electrode 21.

In the illustrated example of the semiconductor element A10, the switching circuit 30 serves as a lower arm circuit (low side region). Accordingly, the reverse face electrode 22 is the OUT electrode through which the drain current of the switching circuit 30 flows. The obverse face electrode 21 is the GND electrode through which the source current of the switching circuit 30 flows. The input electrode 23 is the IN electrode, to which a gate voltage for driving the switching circuit 30 is applied. The input electrode 23 is electrically connected to the gate of the switching circuit 30 (gate electrode 312 of the plurality of trench gate structures 31).

The control circuit 40 includes an under-voltage protection circuit 41, an overheat protection circuit 42, a surge protection circuit 43, an active clamp circuit 44, a first resistance R1, a second resistance R2, a third resistance R3, and a diode D. Out of these, the under-voltage protection circuit 41, the overheat protection circuit 42, the surge protection circuit 43, the first resistance R1, and the diode D are connected to each other in parallel, in the conduction path between the input electrode 23 and the obverse face electrode 21. The surge protection circuit 43 is also electrically connected to the source of the switching circuit 30. The diode D is, for example, a Schottky barrier diode. The second resistance R2 is connected between the under-voltage protection circuit 41 and the overheat protection circuit 42, in the conduction path between the input electrode 23 and the gate of the switching circuit 30. The third resistance R3 is connected between the surge protection circuit 43 and the gate of the switching circuit 30, in the conduction path between the input electrode 23 and the gate of the switching circuit 30. The active clamp circuit 44 is connected between the reverse face electrode 22 and the gate of the switching circuit 30 (conduction path between the third resistance R3 and the gate of the switching circuit 30).

The under-voltage protection circuit 41 stops the operation of the switching circuit 30, when the potential difference between the input electrode 23 and the obverse face electrode 21, in other words the gate voltage applied to the switching circuit 30, has dropped below a predetermined threshold. Therefore, a malfunction of the switching circuit 30 can be prevented.

The overheat protection circuit 42 detects the temperature of the semiconductor substrate 11 and the epitaxial layer 12 of the main body 10, constituting the drain region of the switching circuit 30, and stops the operation of the switching circuit 30, when the temperature exceeds a predetermined threshold. Accordingly, the temperature of the switching circuit 30 can be prevented from excessively rising, and consequently the switching circuit 30 can be protected.

The surge protection circuit 43 detects the source current of the switching circuit 30, and stops the operation of the switching circuit 30, when the source current exceeds a predetermined threshold. Accordingly, the switching circuit 30 can be prevented from receiving an excessive current, for example originating from an arm short circuit, and consequently the switching circuit 30 can be protected.

The active clamp circuit 44 includes, for example, a Zener diode and a diode connected in series. These are connected in reverse bias. Accordingly, the active clamp circuit 44 can turn off the switching circuit 30, when an excessive surge voltage is applied between the drain and source of the switching circuit 30, and therefore the surge voltage can be suppressed.

Hereunder, an example of the manufacturing method of the semiconductor element A10 will be described, with reference to FIG. 11 to FIG. 20. It is to be noted that the position of the cross-section in FIG. 11 to FIG. 20 (except FIG. 19) corresponds to the position of the cross-section in FIG. 3.

Figure 11:
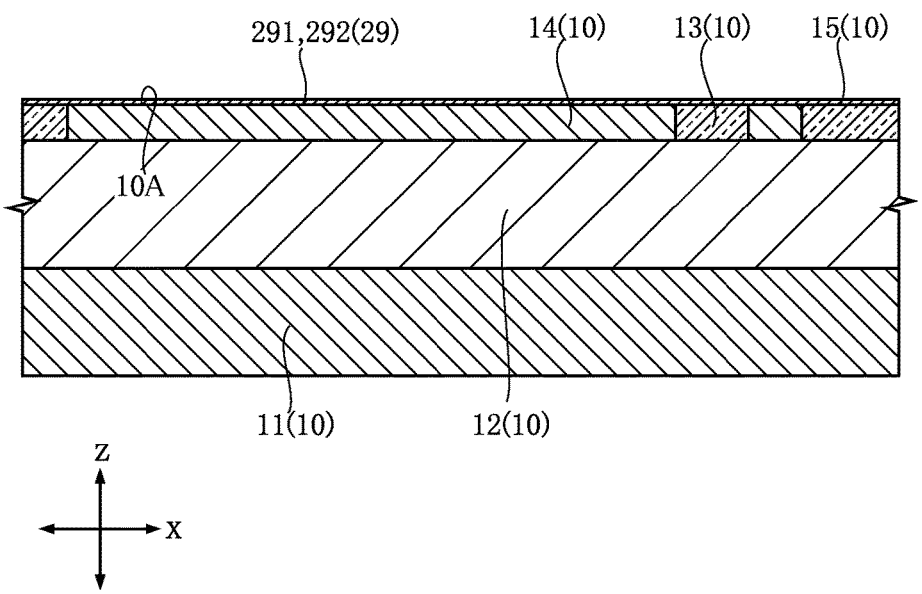
FIG. 11 is a cross-sectional view for explaining a manufacturing process of the semiconductor element shown in FIG. 1.

Referring first to FIG. 11, the epitaxial layer 12, the interlayer dielectric film 13, the interconnect layer 14, and the passivation film 15 are deposited on the semiconductor substrate 11 formed as a wafer, to thereby form the main body 10, after which the underlying layer 29 is formed so as to cover the obverse face 10A of the main body 10. The underlying layer 29 can be formed by sequentially depositing the barrier layer 291 and the seed layer 292 by sputtering, on the obverse face 10A. The barrier layer 291 is formed of titanium. The seed layer 292 is formed of copper.

Figure 12:
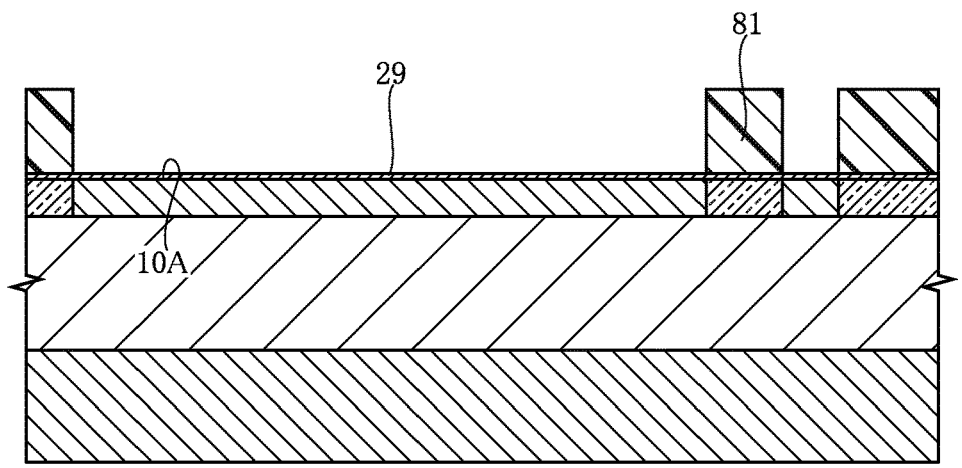
FIG. 12 is a cross-sectional view for explaining the manufacturing process of the semiconductor element shown in FIG. 1.
Figure 12:
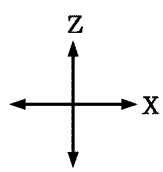

Referring to FIG. 12, a first resist layer 81 is formed, as a mask covering a part of the underlying layer 29. The mask can be formed by applying the first resist layer 81 onto the underlying layer 29 with a spin coater, and then performing photolithography patterning.

Figure 13:
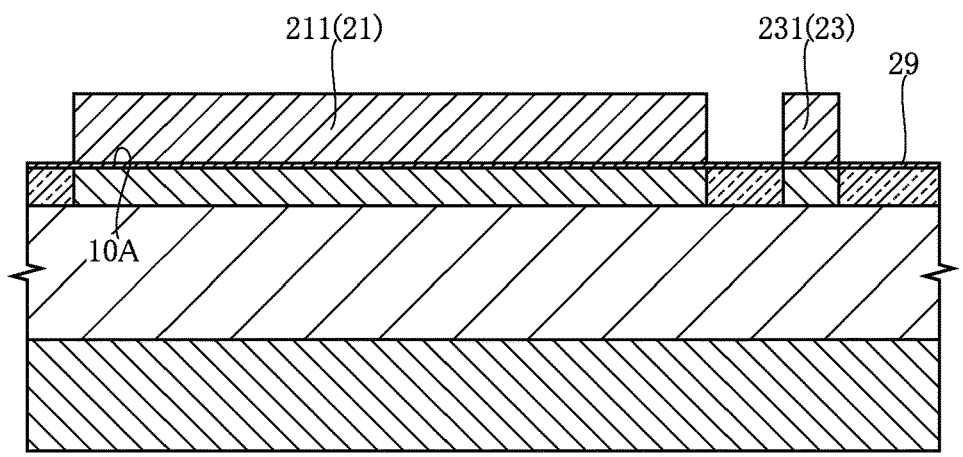
FIG. 13 is a cross-sectional view for explaining the manufacturing process of the semiconductor element shown in FIG. 1.
Figure 13:
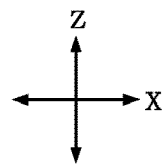

Referring to FIG. 13, the first section 211 of the obverse face electrode 21, and the first layer 231 of the input electrode 23 are deposited on the portion of the underlying layer 29 exposed from the mask of the first resist layer 81. The first section 211 and the first layer 231 can be formed by electrolytic plating, utilizing the underlying layer 29 as the conduction path. The first section 211 and the first layer 231 are both formed of copper. After the first section 211 and the first layer 231 are deposited, the first resist layer 81 is removed.

Figure 14:
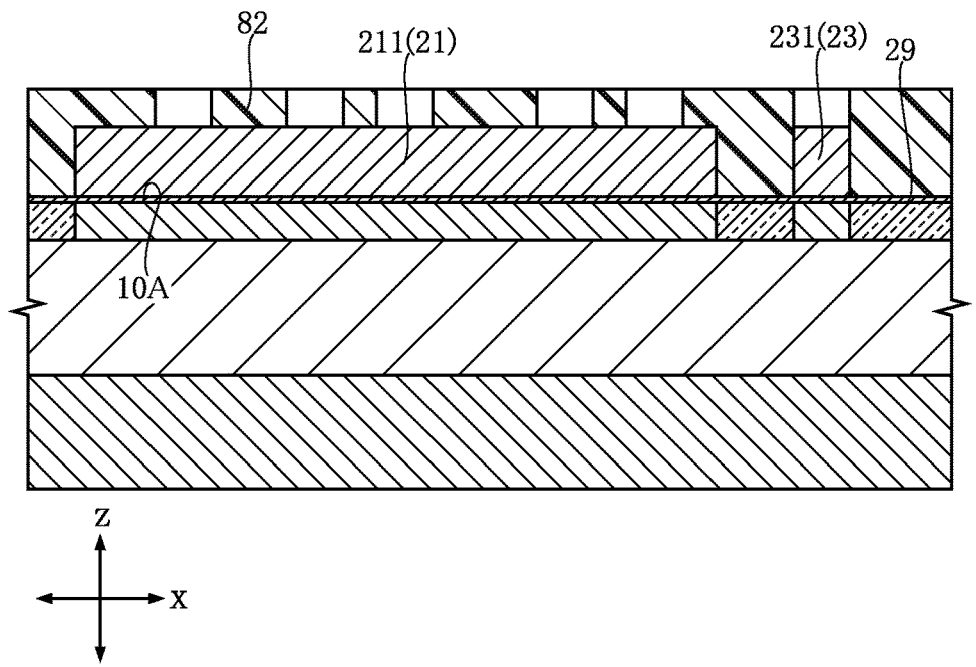
FIG. 14 is a cross-sectional view for explaining the manufacturing process of the semiconductor element shown in FIG. 1.

Referring to FIG. 14, a second resist layer 82 is formed as a mask covering the underlying layer 29, and a part of each of the first section 211 of the obverse face electrode 21 and the first layer 231 of the input electrode 23. The mask can be formed by applying the first resist layer 81 onto the underlying layer 29, the first section 211, and the first layer 231 with a spin coater, and then performing photolithography patterning.

Figure 15:
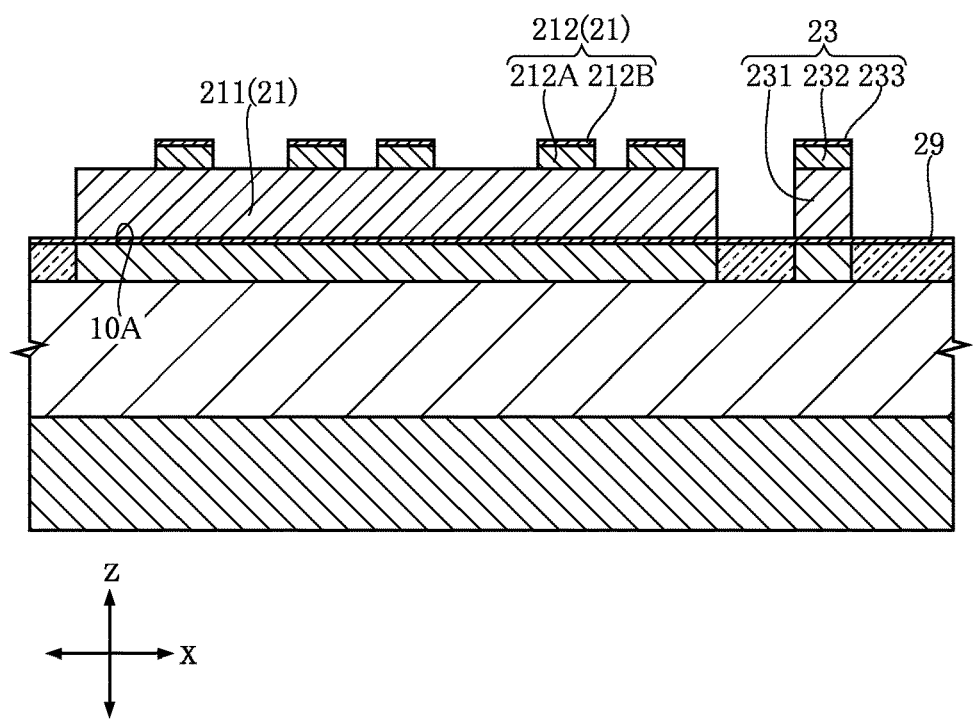
FIG. 15 is a cross-sectional view for explaining the manufacturing process of the semiconductor element shown in FIG. 1.

Referring to FIG. 15, the first layer 212A and the second layer 212B are sequentially deposited to form the second section 212, on the first section 211 of the obverse face electrode 21 exposed from the mask of the second resist layer 82. Likewise, the second layer 232 and the third layer 233 are sequentially deposited on the first layer 231 of the input electrode 23, exposed from the mask of the second resist layer 82. The mentioned layers can be formed by electrolytic plating, utilizing the underlying layer 29 as the conduction path. The first layer 212A and the second layer 232 are formed of nickel. The second layer 212B and the third layer 233 are formed of palladium. After the mentioned layers are deposited, the second resist layer 82 is removed. Through the mentioned process, the obverse face electrode 21 and the input electrode 23 are completed.

Figure 16:
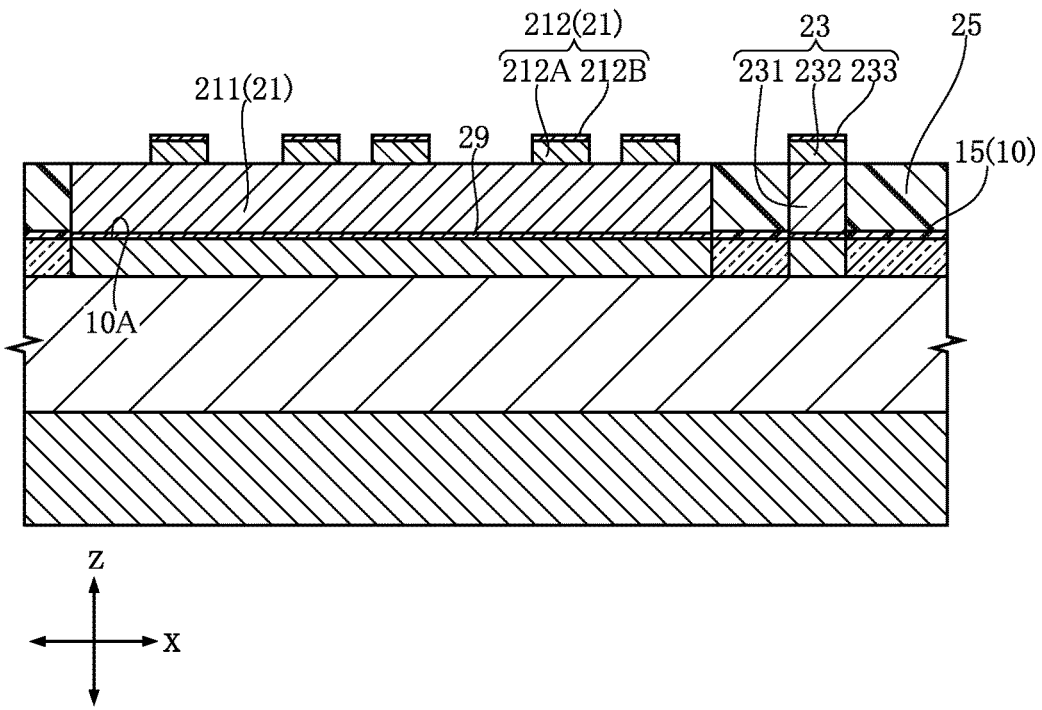
FIG. 16 is a cross-sectional view for explaining the manufacturing process of the semiconductor element shown in FIG. 1.

Referring to FIG. 16, the portion of the underlying layer 29, not covered with the obverse face electrode 21 and the input electrode 23, is removed. The underlying layer 29 can be removed by wet etching. Thereafter, the passivation film 15 and the surface cover film 25, covering the obverse face 10A of the main body 10 and the side face of each of the obverse face electrode 21 and the input electrode 23, are formed. The passivation film 15 can be formed by sequentially depositing a silicon oxide film and a silicon nitride film by plasma chemical vapor deposition (CVD), on the obverse face 10A. The surface cover film 25 can be formed by applying polyimide.

Figure 17:
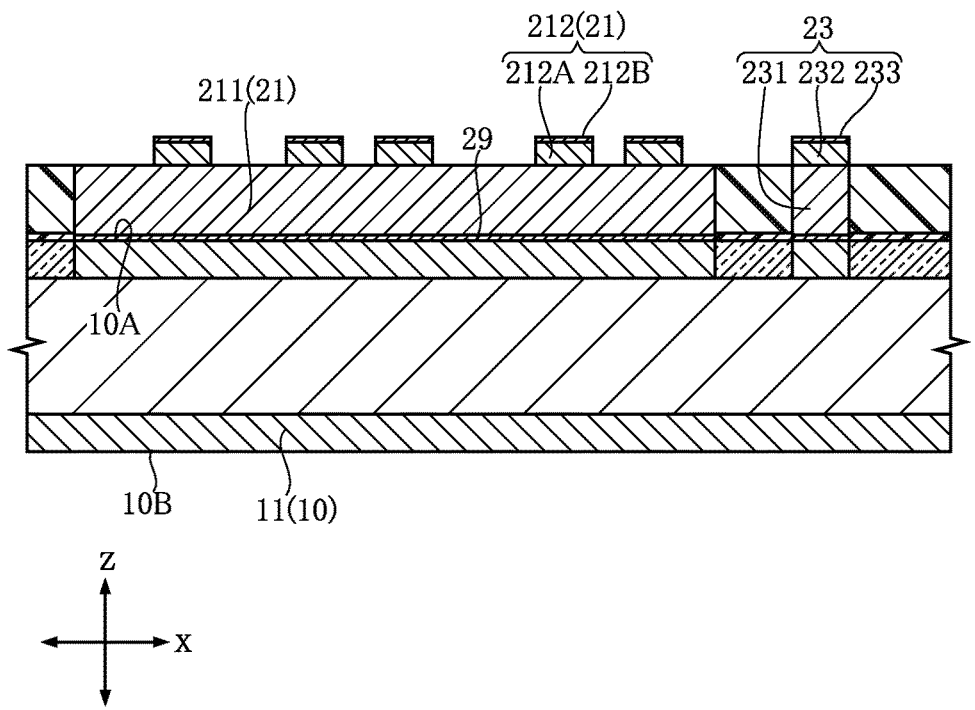
FIG. 17 is a cross-sectional view for explaining the manufacturing process of the semiconductor element shown in FIG. 1.

Referring to FIG. 17, a part of the semiconductor substrate 11 of the main body 10 is removed. This removal can be executed by covering the obverse face electrode 21, the input electrode 23, and the surface cover film 25 with a tape or the like, and then grinding the semiconductor substrate 11 in the thickness direction z. By partially removing the semiconductor substrate 11, the reverse face 10B appears on the main body 10.

Figure 18:
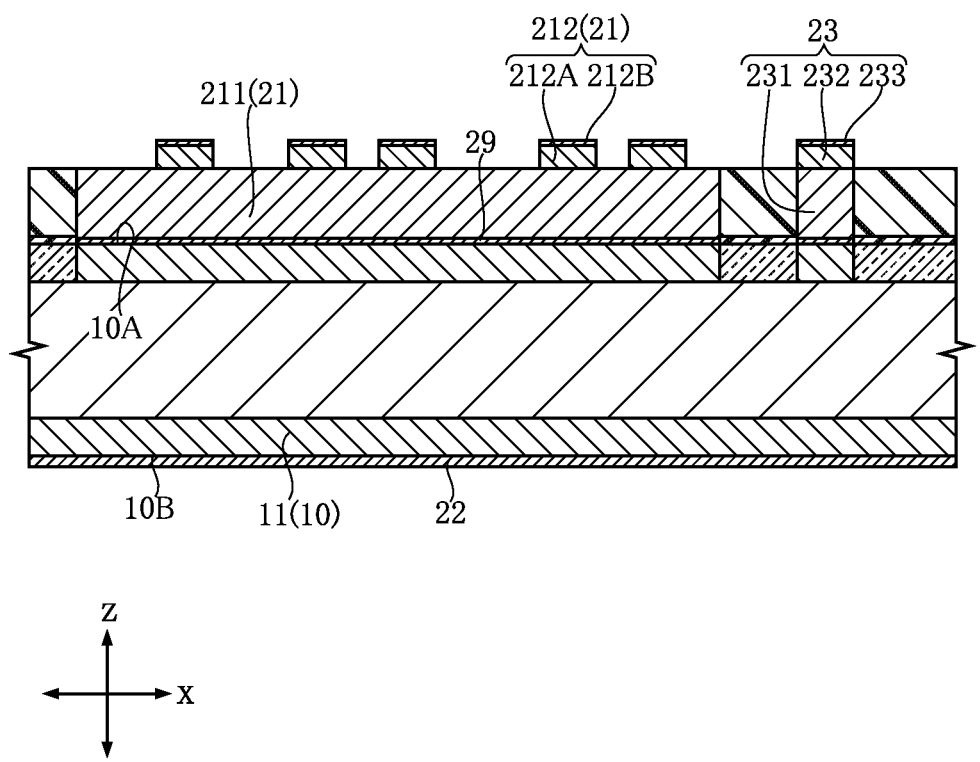
FIG. 18 is a cross-sectional view for explaining the manufacturing process of the semiconductor element shown in FIG. 1.
Figure 19:
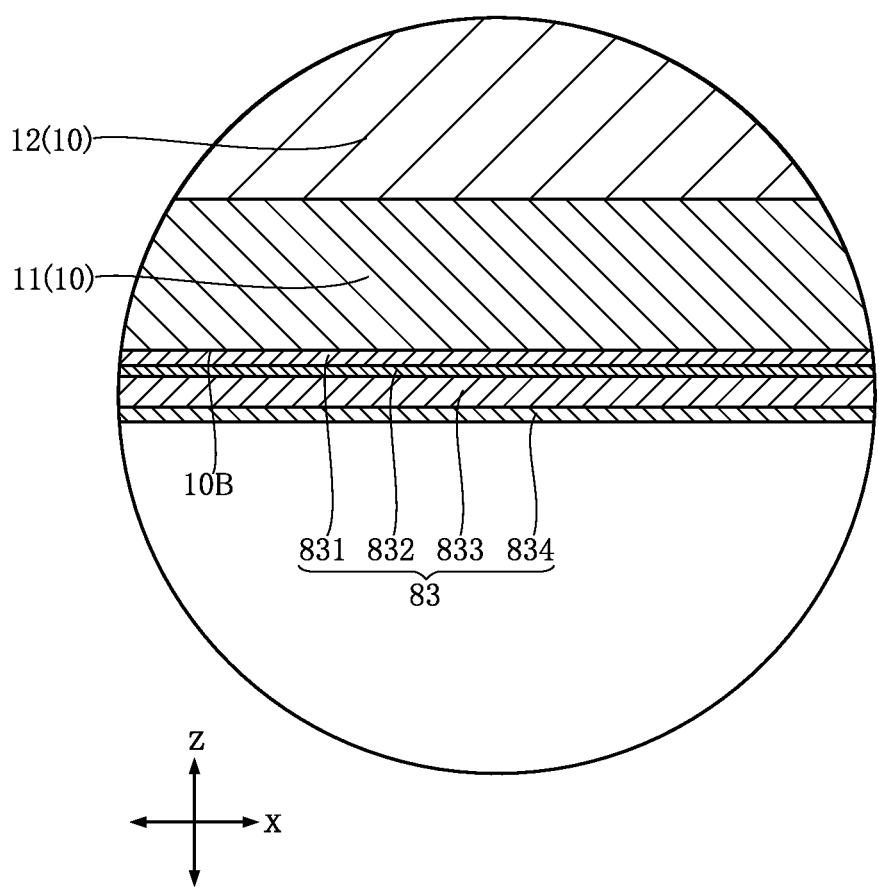
FIG. 19 is a partially enlarged cross-sectional view corresponding to the manufacturing process shown in FIG. 18.

Referring to FIG. 18, the reverse face electrode 22 is formed so as to cover the reverse face 10B of the main body 10. To form the reverse face electrode 22, a plurality of metal layers 83 are deposited on the reverse face 10B by sputtering or vacuum vapor deposition, as shown in FIG. 19. The plurality of metal layers 83 include a first metal layer 831, a second metal layer 832, a third metal layer 833, and a fourth metal layer 834, in the order of proximity to the reverse face 10B. The first metal layer 831 is formed of gold. The second metal layer 832 is formed of nickel. The third metal layer 833 is formed of silver. The fourth metal layer 834 is formed of gold. Then the plurality of metal layers 83 are subjected to heat treatment. As result, the reverse face electrode 22, and the silicide layer 111 of the semiconductor substrate 11 are obtained, as shown in FIG. 6. A major part of the first layer 221 of the reverse face electrode 22 is the third metal layer 833. The second layer 222 of the reverse face electrode 22 corresponds to the fourth metal layer 834. The silicide layer 111 is formed by metallic bonding between the second metal layer 832 and the silicon included in the composition of the semiconductor substrate 11. The first metal layer 831 is diffused to the semiconductor substrate 11, the silicide layer 111, and the first layer 221, in FIG. 6.

Figure 20:
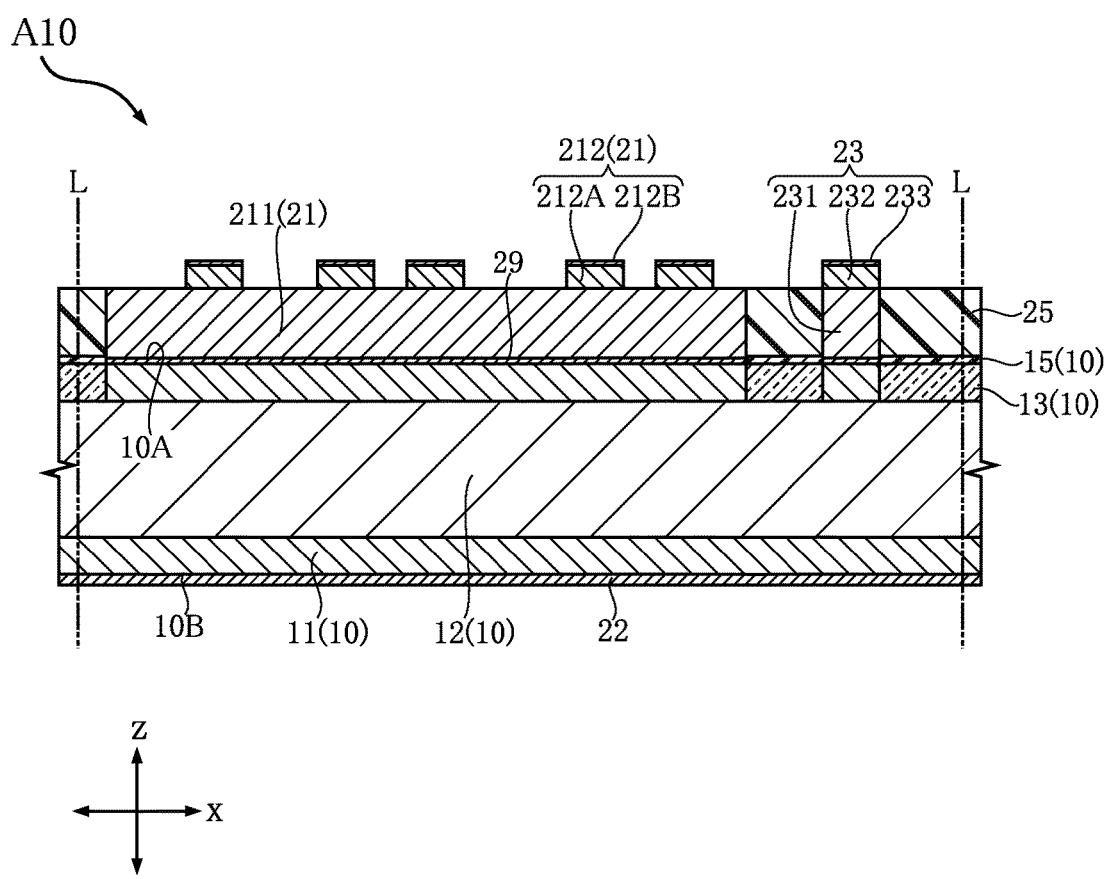
FIG. 20 is a cross-sectional view for explaining the manufacturing process of the semiconductor element shown in FIG. 1.

Referring finally to FIG. 20, the reverse face electrode 22, the semiconductor substrate 11, the epitaxial layer 12, the interlayer dielectric film 13, the passivation film 15, and the surface cover film 25 are cut along a cutting line L, so that the semiconductor element A10 can be obtained. The cutting is performed by blade dicing.

<Semiconductor Device B10>

Figure 21:
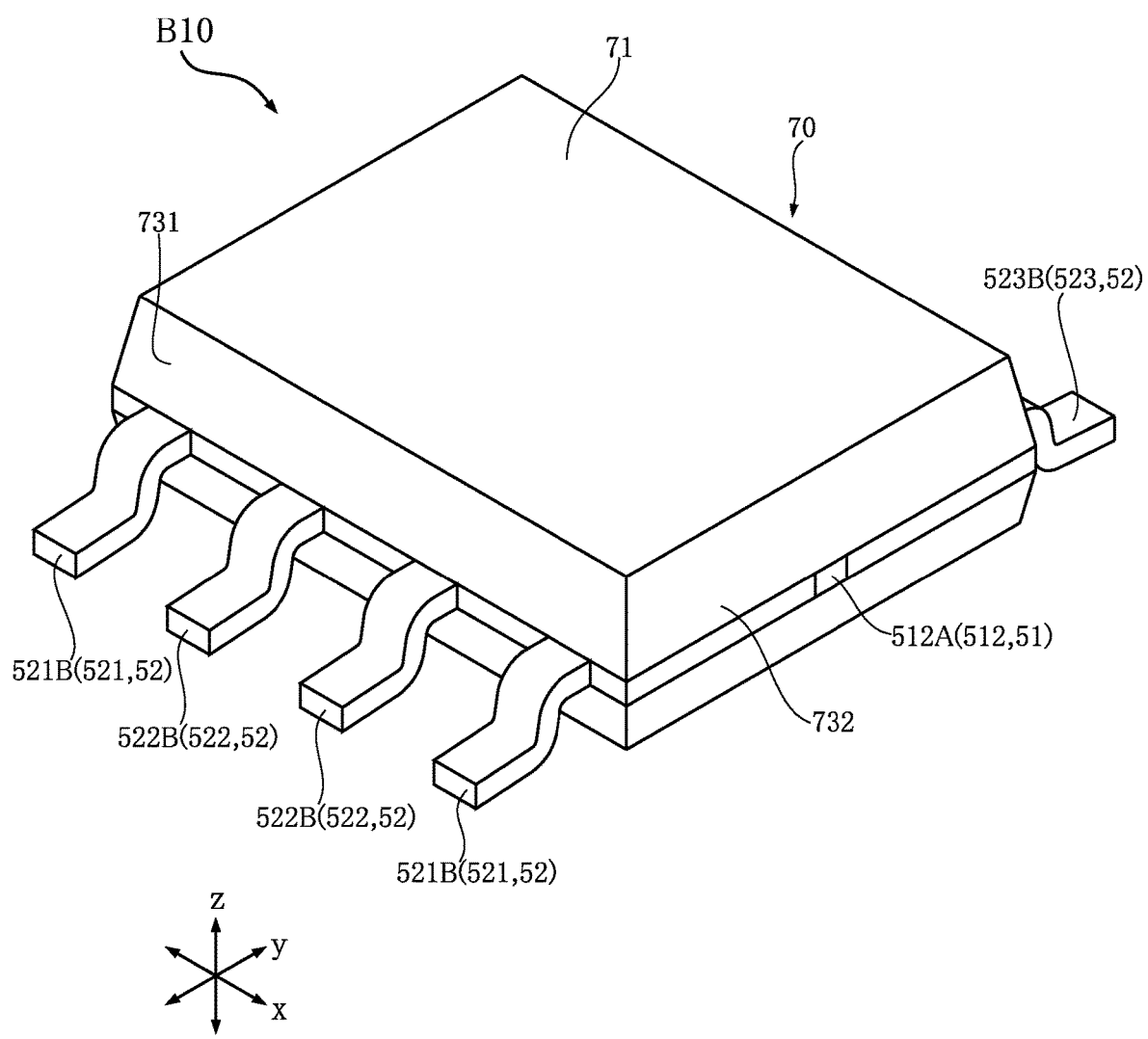
FIG. 21 is a perspective view showing a semiconductor device according to the first embodiment of the present disclosure.
Figure 22:
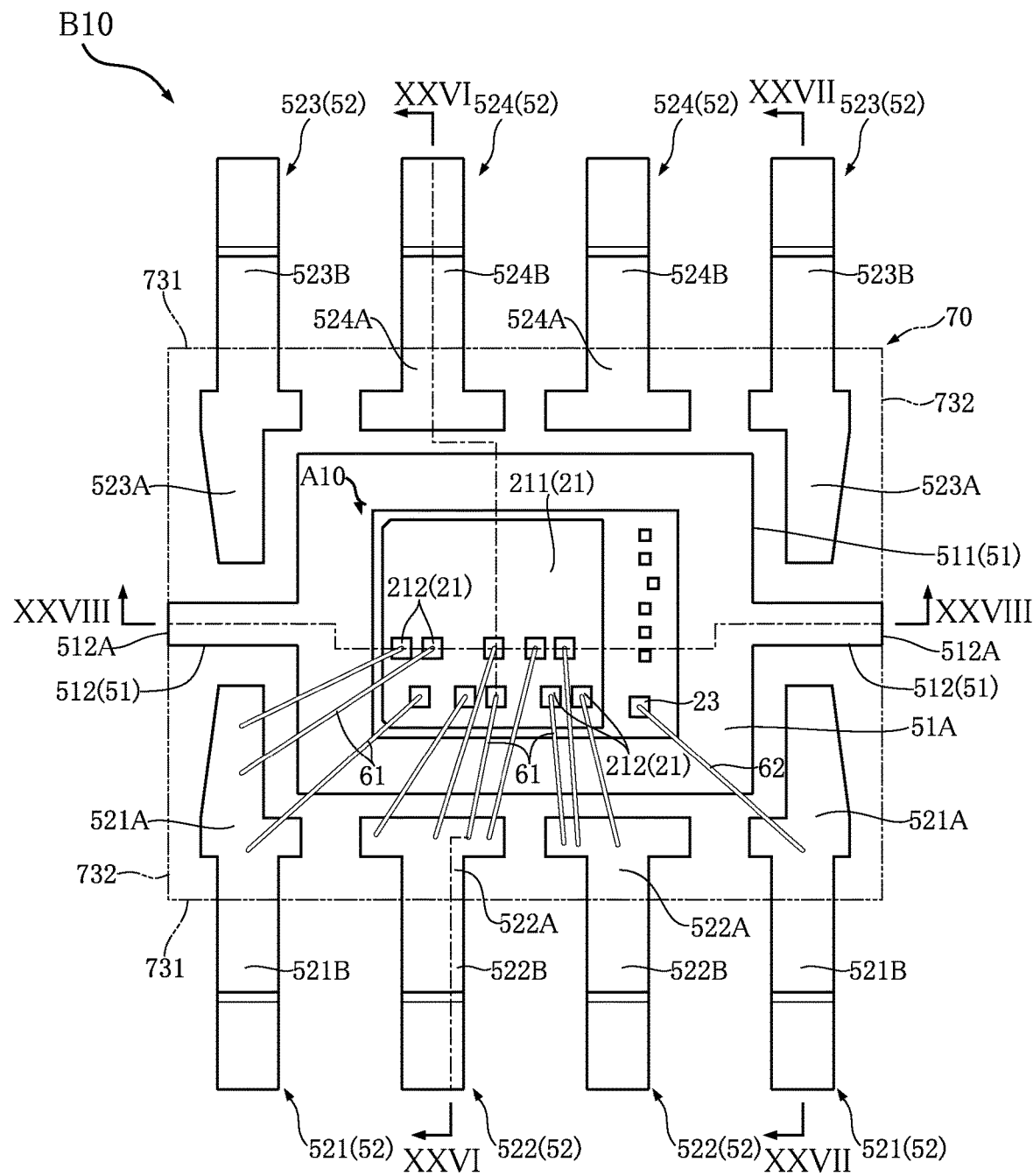
FIG. 22 is a plan view of the semiconductor device shown in FIG. 21, seen through a sealing resin.
Figure 23:
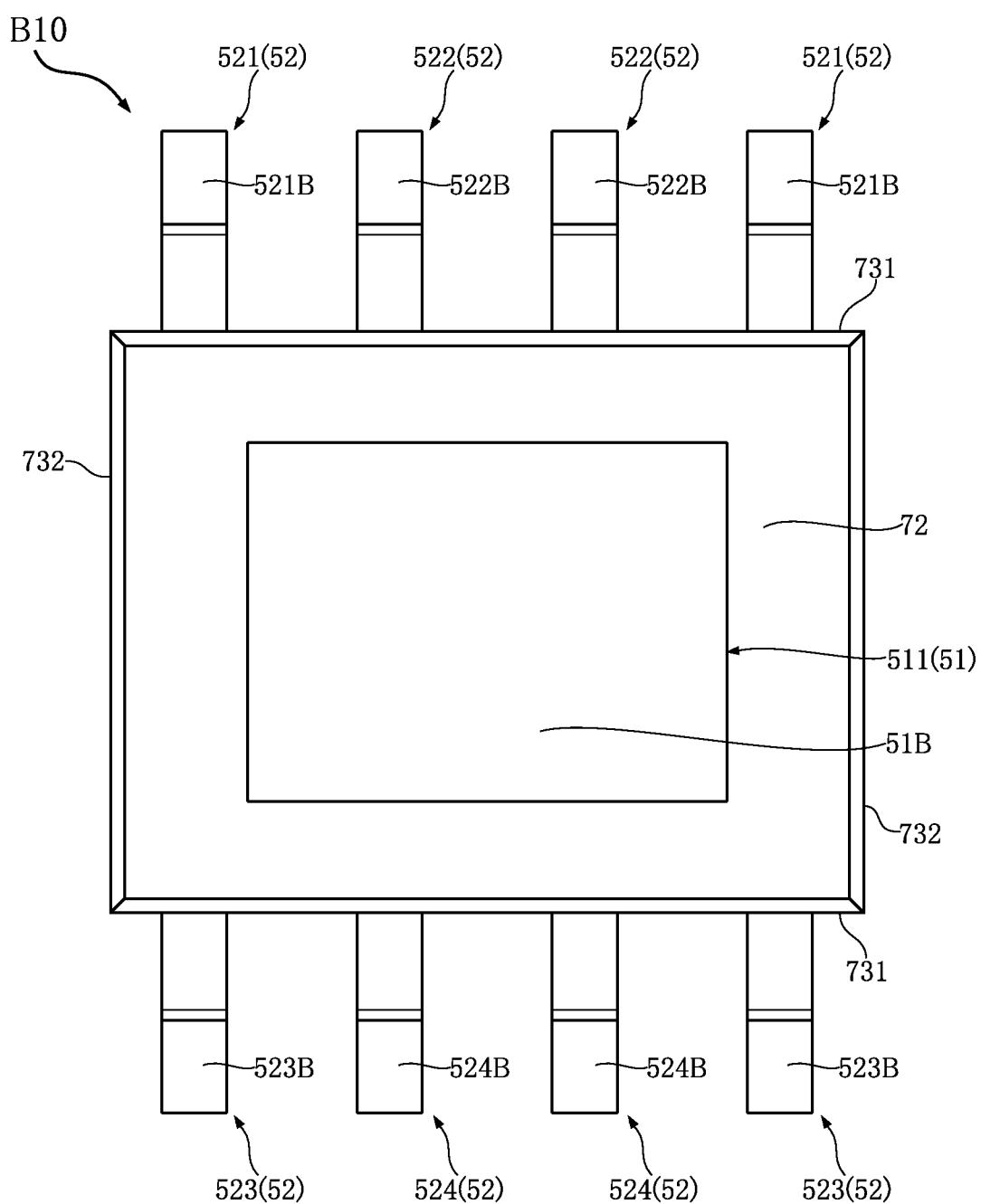
FIG. 23 is a bottom view of the semiconductor device shown in FIG. 21.
Figure 24:
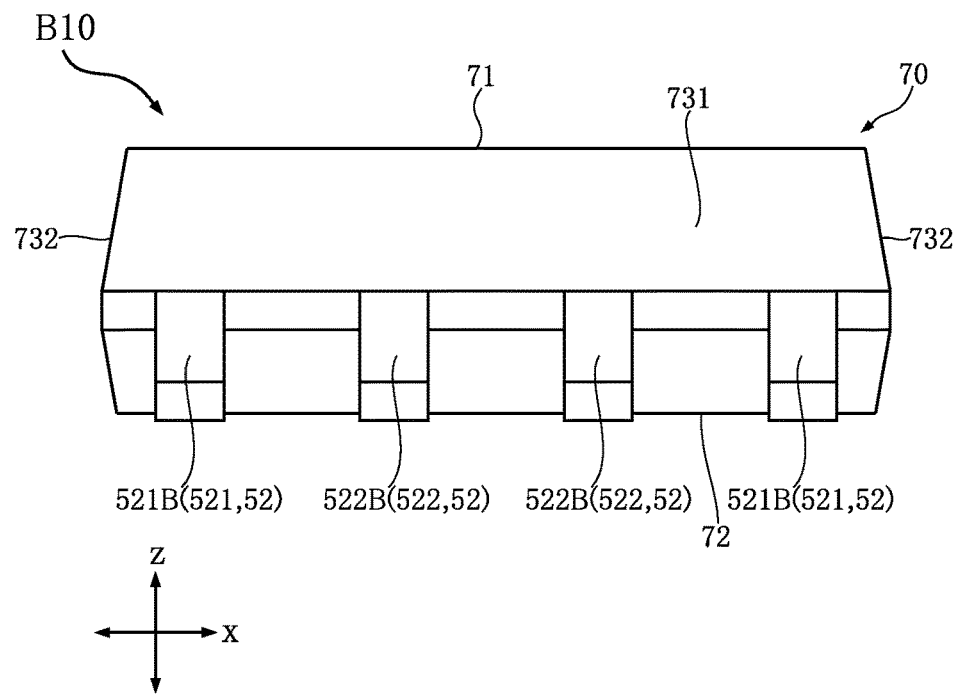
FIG. 24 is a front view of the semiconductor device shown in FIG. 21.

The semiconductor device B10 will be described hereunder, with reference to FIG. 21 to FIG. 29. The semiconductor device B10 shown in these drawings includes the semiconductor element A10, a die pad 51, a plurality of terminals 52, a plurality of first wires 61, a second wire 62, and a sealing resin 70. The semiconductor device B10 is an IPD that can be utilized as a drive source of a motor, an electrical component of a vehicle, and so forth. In the illustrated example of the semiconductor device B10, as shown in FIG. 21, the structural type of the device is a single outline package (SOP). However, the structural type of the semiconductor device B10 is not limited to the SOP. Here, FIG. 22 represents a configuration seen through the sealing resin 70, for the sake of clarity. In FIG. 22, the sealing resin 70 seen through is indicated by an imaginary line (dash-dot-dot line).

Figure 26:
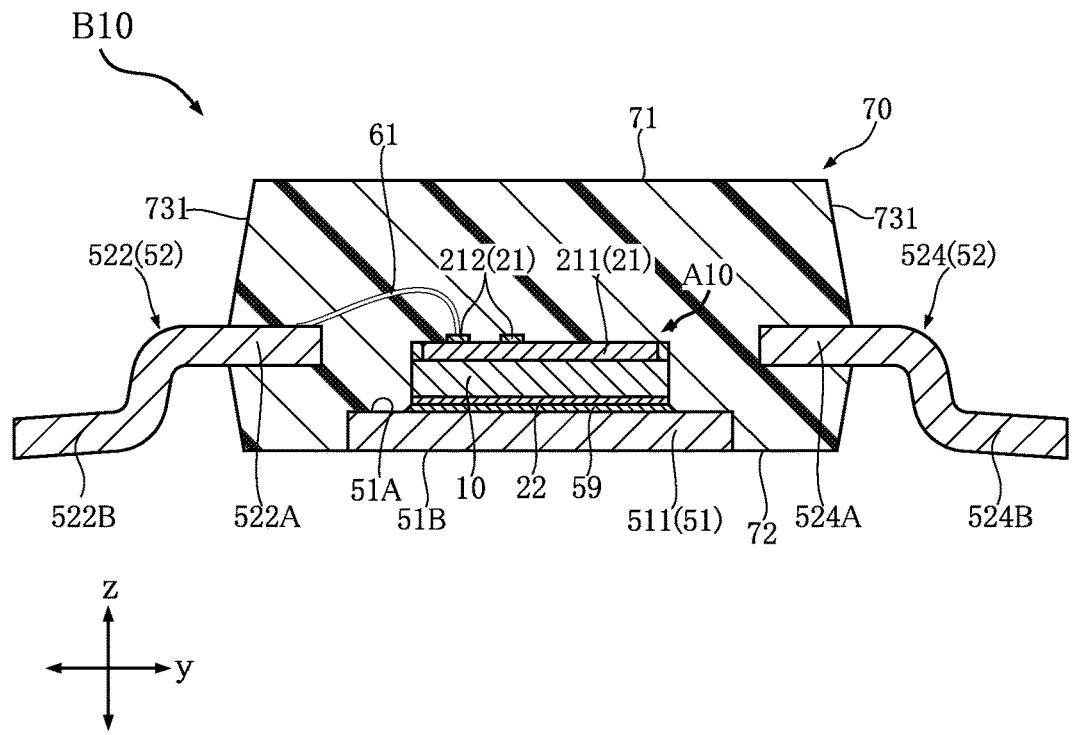
FIG. 26 is a cross-sectional view taken along a line XXVI-XXVI in FIG. 22.
Figure 28:
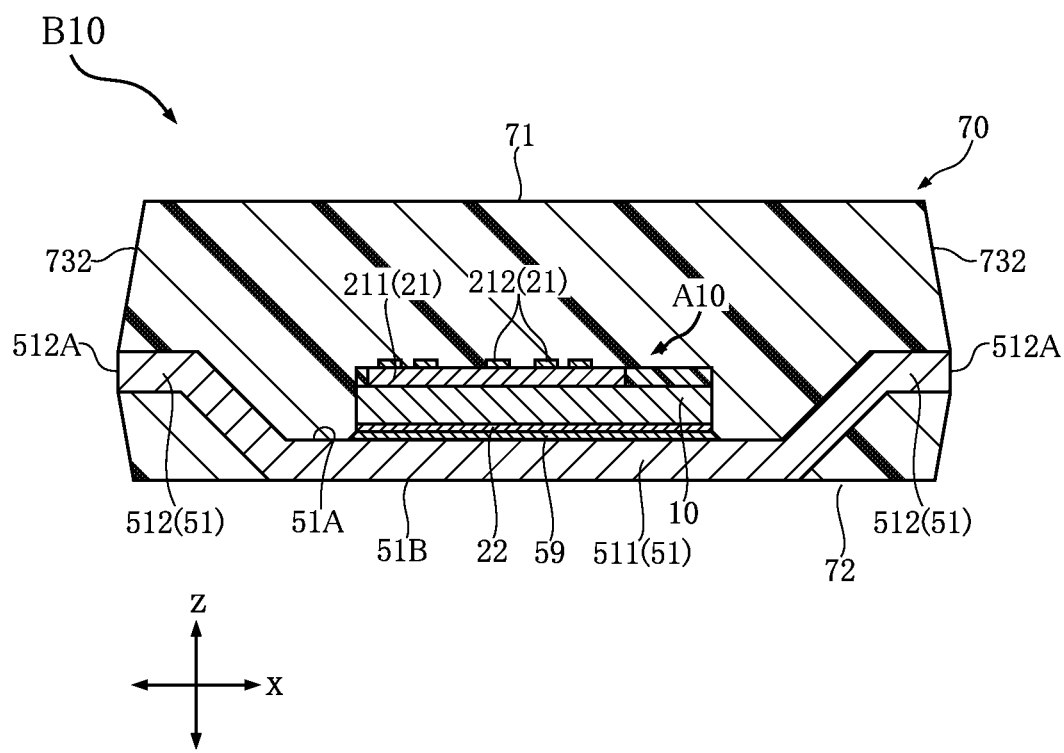
FIG. 28 is a cross-sectional view taken along a line XXVIII-XXVIII in FIG. 22.

On the die pad 51, the semiconductor element A10 is mounted, as shown in FIG. 22, FIG. 26, and FIG. 28. In the manufacturing process of the semiconductor device B10, the die pad 51 is formed from the same lead frame, together with the plurality of terminals 52. The lead frame is, for example, formed of copper or a copper-based alloy. As shown in FIG. 22, the die pad 51 includes a main section 511 and a pair of suspension sections 512.

As shown in FIG. 22, the main section 511 has a rectangular shape, as viewed along the thickness direction z. As shown in FIG. 22, FIG. 23, FIG. 26, and FIG. 28, the main section 511 includes a pad obverse face 51A and a pad reverse face 51B. The pad obverse face 51A is arranged to face in the same direction as the obverse face 10A of the main body 10, in the thickness direction z. The pad obverse face 51A is, for example, silver-plated. A bonding layer 59 is interposed between the pad obverse face 51A and the reverse face electrode 22 of the semiconductor element A10. The bonding layer 59 is electrically conductive. In the semiconductor element A10, the bonding layer 59 is a lead-free solder, predominantly composed of, for example, tin (Sn) and silver. Accordingly, the reverse face electrode 22 is electrically connected to the die pad 51, via the bonding layer 59. The pad reverse face 51B is arranged to face in the direction opposite to the pad obverse face 51A. The pad reverse face 51B is exposed from the sealing resin 70. The pad reverse face 51B is used to mount the semiconductor device B10 on a circuit board. The pad reverse face 51B is, for example, tin-plated. In the semiconductor device B10, the die pad 51 corresponds to the OUT terminal of the semiconductor element A10 shown in FIG. 10.

Figure 25:
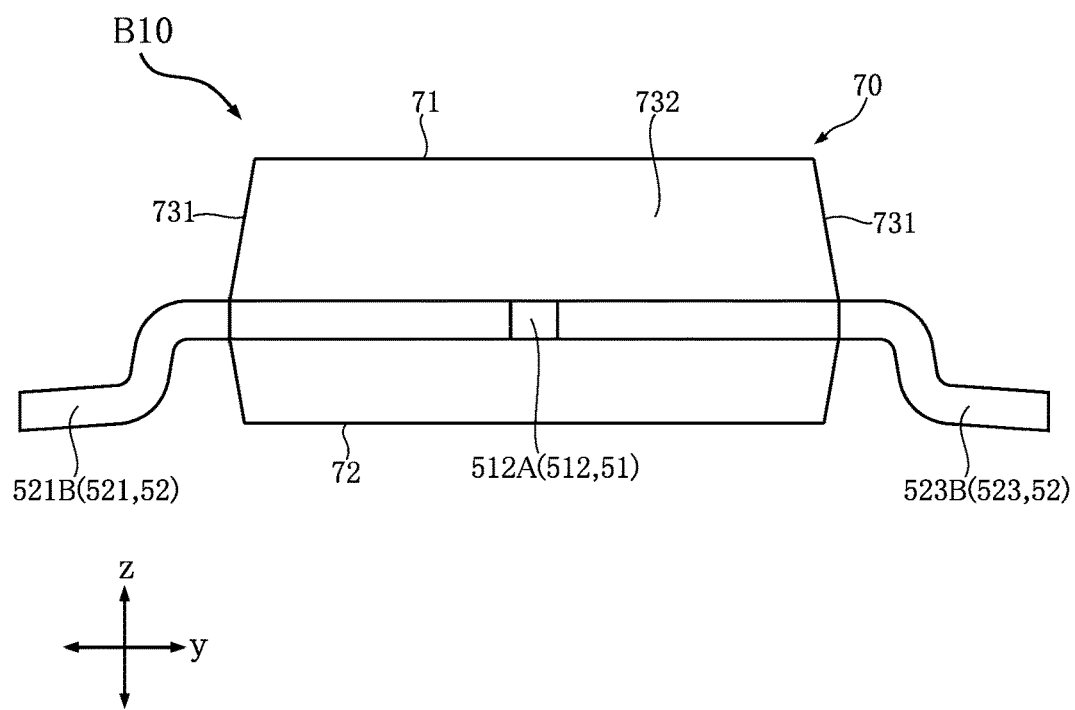
FIG. 25 is a right side view of the semiconductor device shown in FIG. 21.

As shown in FIG. 22, the pair of suspension sections 512 are continuous with the respective end portions of the main section 511 in the first direction x. The pair of suspension sections 512 have a belt-like shape extending in the first direction x, as viewed along the thickness direction z. As shown in FIG. 28, the pair of suspension sections 512 are bent in a gull-wing shape, as viewed in the second direction y. In the manufacturing process of the semiconductor device B10, the pair of suspension sections 512 correspond to the part that allows the main section 511 to be supported by the lead frame. As shown in FIG. 22 and FIG. 25, the pair of suspension sections 512 each include an end face 512A that faces in the first direction x. The pair of end faces 512A are exposed from the sealing resin 70.

The plurality of terminals 52 are, as shown in FIG. 22, spaced apart from the die pad 51. In the illustrated example of the semiconductor device B10, the plurality of terminals 52 include a pair of first terminals 521, a pair of second terminals 522, a pair of third terminals 523, and a pair of fourth terminals 524.

Figure 27:
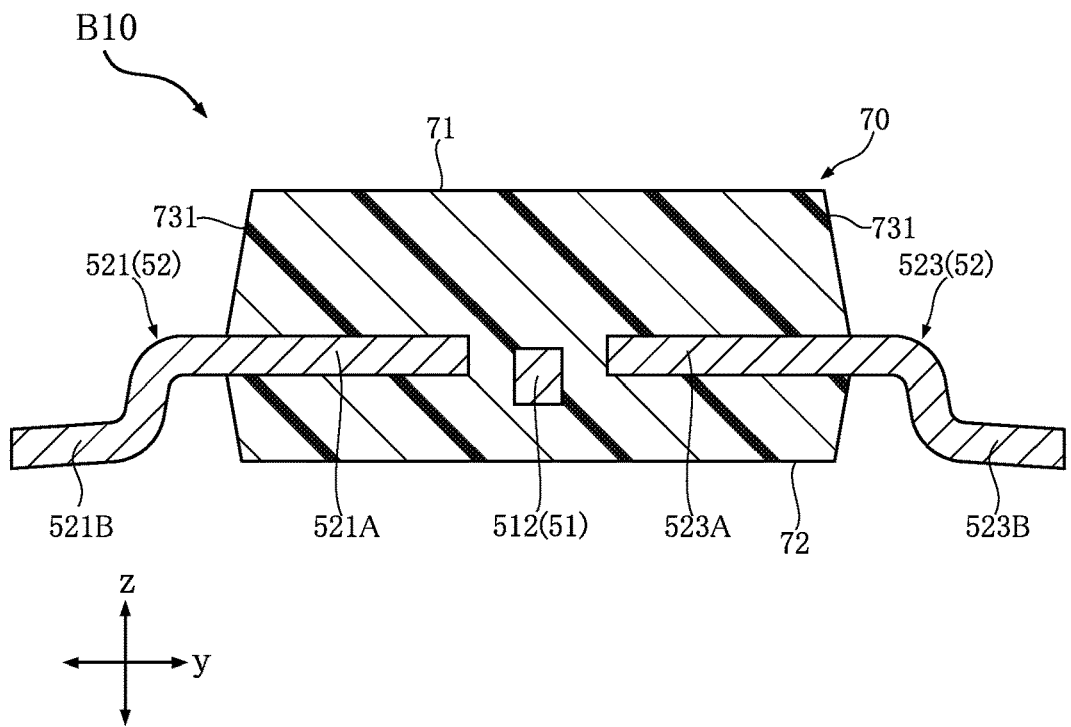
FIG. 27 is a cross-sectional view taken along a line XXVII-XXVII in FIG. 22.

As shown in FIG. 22 and FIG. 27, the pair of first terminals 521 are located at the respective end portions of the semiconductor device B10, in the first direction x. The pair of first terminals 521 each include a pad section 521A and an exposed portion 521B. The pad section 521A is covered with the sealing resin 70. As viewed along the thickness direction z, the pair of pad sections 521A are line-symmetrical to each other, with respect to an imaginary axis drawn along the second direction y. The surface of the pad section 521A is, for example, silver-plated. The exposed portion 521B is exposed from the sealing resin 70. As viewed along the thickness direction z, the exposed portion 521B extends in the first direction x, from the pad section 521A. As shown in FIG. 25, the exposed portion 521B is bent in a gull-wing shape, as viewed in the first direction x. The pair of exposed portions 521B have the same shape as each other. The exposed portion 521B is utilized to mount the semiconductor device B10 on a circuit board. The surface of the exposed portion 521B is, for example, tin-plated.

As shown in FIG. 22 and FIG. 26, the pair of second terminals 522 are located between the pair of first terminals 521, in the first direction x. The pair of second terminals 522 each include a pad section 522A and an exposed portion 522B. The pad section 522A is covered with the sealing resin 70. The pair of pad portions 522A have the same shape as each other. The surface of the pad section 522A is, for example, silver-plated. The exposed portion 522B is exposed from the sealing resin 70. As viewed along the thickness direction z, the exposed portion 522B extends in the second direction y, from the pad section 522A. The pair of exposed portions 522B have the same shape as that of the pair of exposed portions 521B. The exposed portion 522B is utilized to mount the semiconductor device B10 on a circuit board. The surface of the exposed portion 522B is, for example, tin-plated.

As shown in FIG. 22 and FIG. 27, the pair of third terminals 523 are located on the opposite side of the pair of first terminals 521 in the second direction y, with respect to the die pad 51. The pair of third terminals 523 are opposed to the pair of first terminals 521, in the second direction y. The pair of third terminals 523 each include a pad section 523A and an exposed portion 523B. The pad section 523A is covered with the sealing resin 70. As viewed along the thickness direction z, the pair of pad sections 523A are line-symmetrical to each other, with respect to an axis drawn along the second direction y. The surface of the pad section 523A is, for example, silver-plated. The exposed portion 523B is exposed from the sealing resin 70. As viewed along the thickness direction z, the exposed portion 523B extends in the second direction y, from the pad section 523A. The pair of exposed portions 523B have the same shape as that of the pair of exposed portions 521B. The exposed portion 523B is utilized to mount the semiconductor device B10 on a circuit board. The surface of the exposed portion 523B is, for example, tin-plated.

As shown in FIG. 22 and FIG. 26, the pair of fourth terminals 524 are located on the opposite side of the pair of second terminals 522 in the second direction y, with respect to the die pad 51. The pair of fourth terminals 524 are located between the pair of third terminals 523, in the first direction x. The pair of fourth terminals 524 are opposed to the pair of second terminals 522, in the second direction y.

The pair of fourth terminals 524 each include a pad section 524A and an exposed portion 524B. The pad section 524A is covered with the sealing resin 70. The pair of pad portions 524A have the same shape as each other. The surface of the pad section 524A is, for example, silver-plated. The exposed portion 524B is exposed from the sealing resin 70. As viewed along the thickness direction z, the exposed portion 524B extends in the second direction y, from the pad section 524A. The pair of exposed portions 524B have the same shape as that of the pair of exposed portions 521B. The exposed portion 524B is utilized to mount the semiconductor device B10 on a circuit board. The surface of the exposed portion 524B is, for example, tin-plated.

The plurality of first wires 61 are, as shown in FIG. 22 and FIG. 26, connected between the plurality of second sections 212 of the obverse face electrode 21, and the pad section 521A of one of the pair of first terminals 521 and the pad section 522A of the pair of second terminals 522, out of the plurality of terminals 52. The composition of the plurality of first wires 61 includes copper. Accordingly, the obverse face electrode 21 is electrically connected to one of the pair of first terminals 521 and the pair of second terminals 522, via the plurality of first wires 61. In the semiconductor device B10, one of the pair of first terminals 521 and the pair of second terminals 522 correspond to the GND terminal of the semiconductor element A10 shown in FIG. 10.

Figure 29:
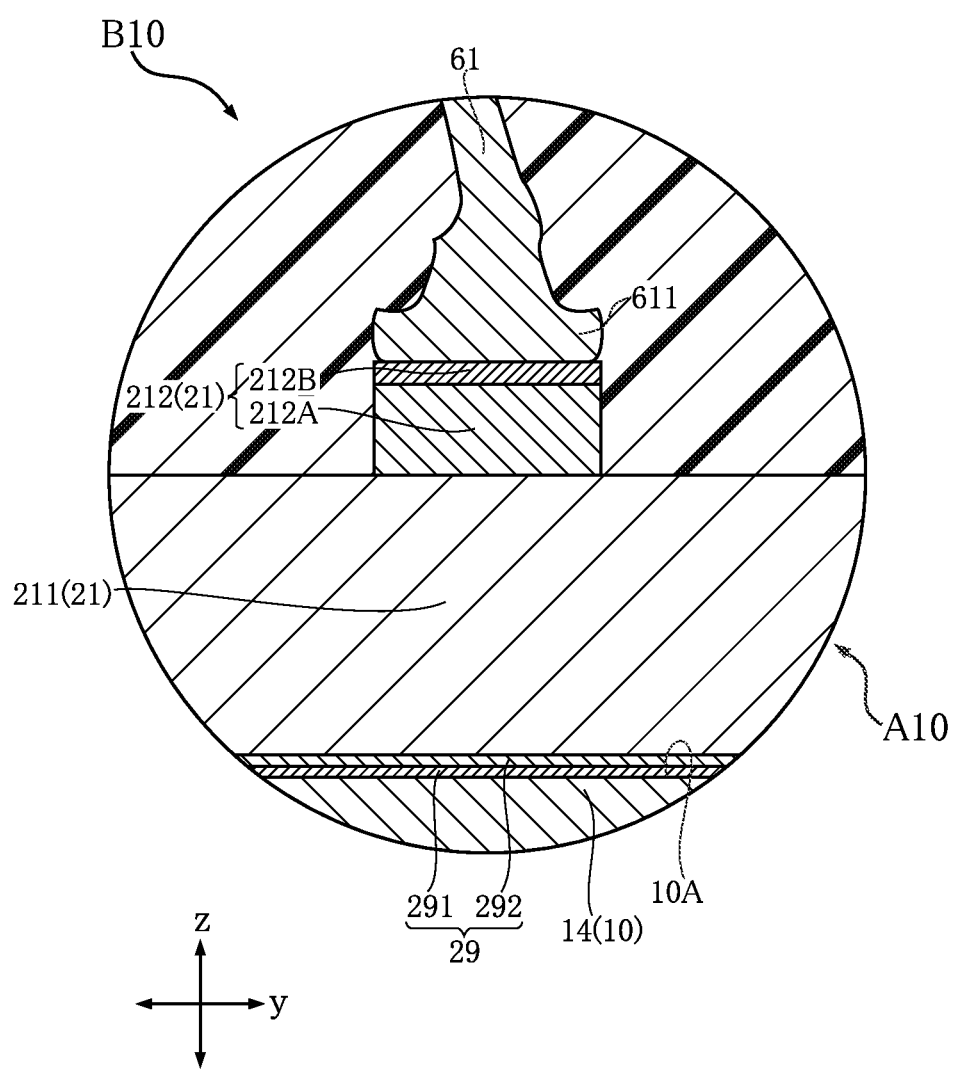
FIG. 29 is a partially enlarged cross-sectional view from FIG. 26.

As shown in FIG. 29, a bonding portion 611 is formed at an end portion of each of the plurality of first wires 61, to be bonded to the second layer 212B of one of the plurality of second sections 212 of the obverse face electrode 21. The plurality of bonding portions 611 are each formed by wire bonding. The bonding portion 611 is the ball-shaped portion, formed first in the wire bonding process.

The second wire 62 is, as shown in FIG. 22, connected between the input electrode 23 and the pad section 521A of one of the pair of first terminals 521, to which the plurality of first wires 61 are not connected. In the illustrated example of the semiconductor device B10, the composition of the second wire 62 includes copper. The composition of the second wire 62 may include gold, in place of copper. Accordingly, the input electrode 23 is electrically connected to the mentioned first terminal 521, via the second wire 62. In the semiconductor device B10, this first terminal 521 corresponds to the IN terminal of the semiconductor element A10 shown in FIG. 10.

The sealing resin 70 covers, as shown in FIG. 26 to FIG. 28, the semiconductor element A10, the plurality of first wires 61, the second wire 62, and a part of each of the die pad 51 and the plurality of terminals 52. The sealing resin 70 is formed of a material containing black epoxy resin. The sealing resin 70 includes a top face 71, a bottom face 72, a pair of first side faces 731, and a pair of second side faces 732.

As shown in FIG. 26 to FIG. 28, the top face 71 is arranged to face to the side on which the obverse face electrode 21 is located with respect to the main body 10 of the semiconductor element A10, in the thickness direction z. The bottom face 72 is arranged to face to the opposite side of the top face 71. From the bottom face 72, the pad reverse face 51B of the main section 511 of the die pad 51 is exposed. Accordingly, the semiconductor device B10 is formed such that a part of the die pad 51 is exposed from the sealing resin 70. The bottom face 72 has a frame shape surrounding the pad reverse face 51B.

As shown in FIG. 22 to FIG. 25, the pair of first side faces 731 are spaced apart from each other, in the second direction y. The pair of first side faces 731 are each continuous with the top face 71 and the bottom face 72, at the end portions in the thickness direction z. From one of the pair of first side faces 731, the exposed portion 521B of the pair of first terminals 521, and the exposed portion 522B of the pair of second terminals 522 are exposed. From the other of the pair of first side faces 731, the exposed portion 523B of the pair of third terminals 523, and the exposed portion 524B of the pair of fourth terminals 524 are exposed.

As shown in FIG. 22 to FIG. 25, the pair of second side faces 732 are spaced apart from each other, in the first direction x. The pair of second side faces 732 are each continuous with the top face 71 and the bottom face 72, at the end portions in the thickness direction z. The pair of second side faces 732 are each continuous with the pair of first side faces 731, at the end portions in the second direction y. From the pair of second side faces 732, the respective end faces 512A of the pair of suspension sections 512 of the die pad 51 are exposed.

The semiconductor element A10 and the semiconductor device B10 provide the following advantageous effects.

In the semiconductor element A10, the obverse face electrode 21, electrically connected to the main body 10, includes the first section 211 located on the obverse face 10A of the main body 10, and the plurality of second sections 212 located in contact with the first section 211. The plurality of second sections 212 protrude from the first section 211, in the direction in which the obverse face 10A faces, in the thickness direction z. As viewed along the thickness direction z, the total area of the plurality of second sections 212 is smaller than the area of the first section 211, including the portion thereof overlapping with the plurality of second sections 212. Accordingly, the total volume of the plurality of second sections 212 can be made smaller than the volume of the first section 211, and therefore fluctuation in volume of the obverse face electrode 21 arising from temperature can be suppressed. Therefore, the semiconductor element A10 can be prevented from being warped in the thickness direction z. Consequently, the semiconductor element A10 presents improved heat dissipation performance, and can be prevented from being warped.

The composition of the first section 211 of the obverse face electrode 21 includes copper. Accordingly, the obverse face electrode 21 has relatively high thermal conductivity, and therefore the heat dissipation performance of the semiconductor element A10 can be improved. To improve the heat dissipation performance of the semiconductor element A10, it is preferable that the ratio of the area of the obverse face electrode 21, to the area of the obverse face 10A of the main body 10, is not smaller than 50% and not greater than 90%, as viewed along the thickness direction z. In addition, it is preferable that the obverse face electrode 21 has an area equal to or larger than 1.0 mm$^2$, as viewed in the thickness direction z, from the viewpoint of improving the heat dissipation performance of the semiconductor element A10.

On the main body 10, the switching circuit 30 and the control circuit 40, electrically connected to the switching circuit 30, are provided. Accordingly, the semiconductor element A10 possesses not only the switching circuit 30 itself, but also the control function for the switching circuit 30. Further, the obverse face electrode 21 overlaps with the switching circuit 30. Therefore, the heat generated by driving the switching circuit 30 can be more efficiently dissipated.

The semiconductor device B10 includes the semiconductor element A10, the die pad 51 on which the semiconductor element A10 is mounted, and the electrically conductive bonding layer 59 interposed between the die pad 51 and the reverse face electrode 22 of the semiconductor element A10. As described above, the semiconductor element A10 is prevented from being warped, and therefore the bonding strength of the semiconductor element A10 to the die pad 51 can also be prevented from being degraded. Further, the semiconductor device B10 includes the terminals 52 spaced apart from the die pad 51, and the wire connected between one of the plurality of second sections 212 of the obverse face electrode 21 of the semiconductor element A10 and the terminal 52 (one of the plurality of first wires 61). The composition of the wire includes copper. Therefore, the heat dissipation performance of the semiconductor element A10, mounted in the semiconductor device B10, can be further improved.

In the semiconductor element A10, the plurality of second sections 212 of the obverse face electrode 21 each include the first layer 212A formed on the first section 211, and the second layer 212B formed on the first layer 212A. The composition of both of the first layer 212A and the second layer 212B includes a metal element. The metal element included in the composition of the second layer 212B is different from the metal element included in the composition of the first layer 212A. Accordingly, in the semiconductor device B10, although the composition of the first section 211 and the first wire 61 includes copper, one of the plurality of first wires 61 can be securely connected to one of the plurality of second sections 212, by wire bonding. The plurality of second sections 212 can serve to mitigate a thermal shock imposed on the main body 10, because of the plurality of first wires 61 connected thereto. From such a viewpoint, it is preferable that the composition of the first layer 212A includes nickel, and the composition of the second layer 212B includes palladium.

The semiconductor element A10 further includes the underlying layer 29, interposed between the obverse face 10A of the main body 10 and the first section 211 of the obverse face electrode 21. The underlying layer 29 includes the barrier layer 291 located in contact with the obverse face 10A, and the seed layer 292 interposed between the barrier layer 291 and the first section 211. Therefore, the obverse face electrode 21 can be easily formed, by electrolytic plating using the underlying layer 29 as the conduction path. In addition, the barrier layer 291 serves to prevent the metal constituting the obverse face electrode 21 from diffusing to the main body 10.

The semiconductor element A10 further includes the reverse face electrode 22, provided on the reverse face 10B of the main body 10, and electrically connected to the main body 10. On the main body 10 (semiconductor substrate 11), the silicide layer 111, including the reverse face 10B and located in contact with the reverse face electrode 22, is provided. The composition of the silicide layer 111 includes silicon and a metal element other than silicon. Such a configuration improves the bonding strength between the reverse face 10B and the reverse face electrode 22. It is preferable that the metal element other than silicon, included in the composition of the silicide layer 111, is nickel.

Second Embodiment

Figure 30:
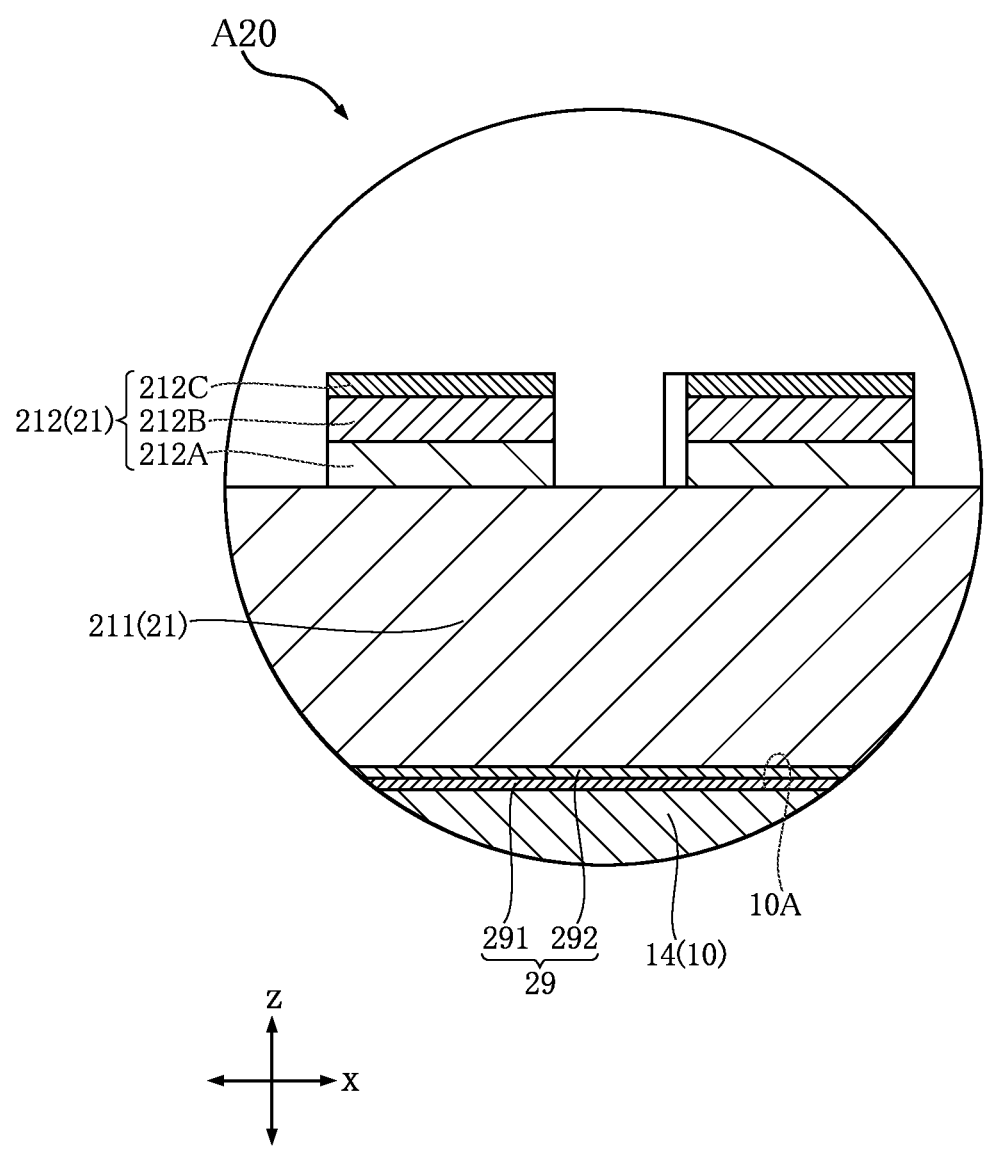
FIG. 30 is a partially enlarged cross-sectional view of a semiconductor element according to a second embodiment of the present disclosure.
Figure 31:
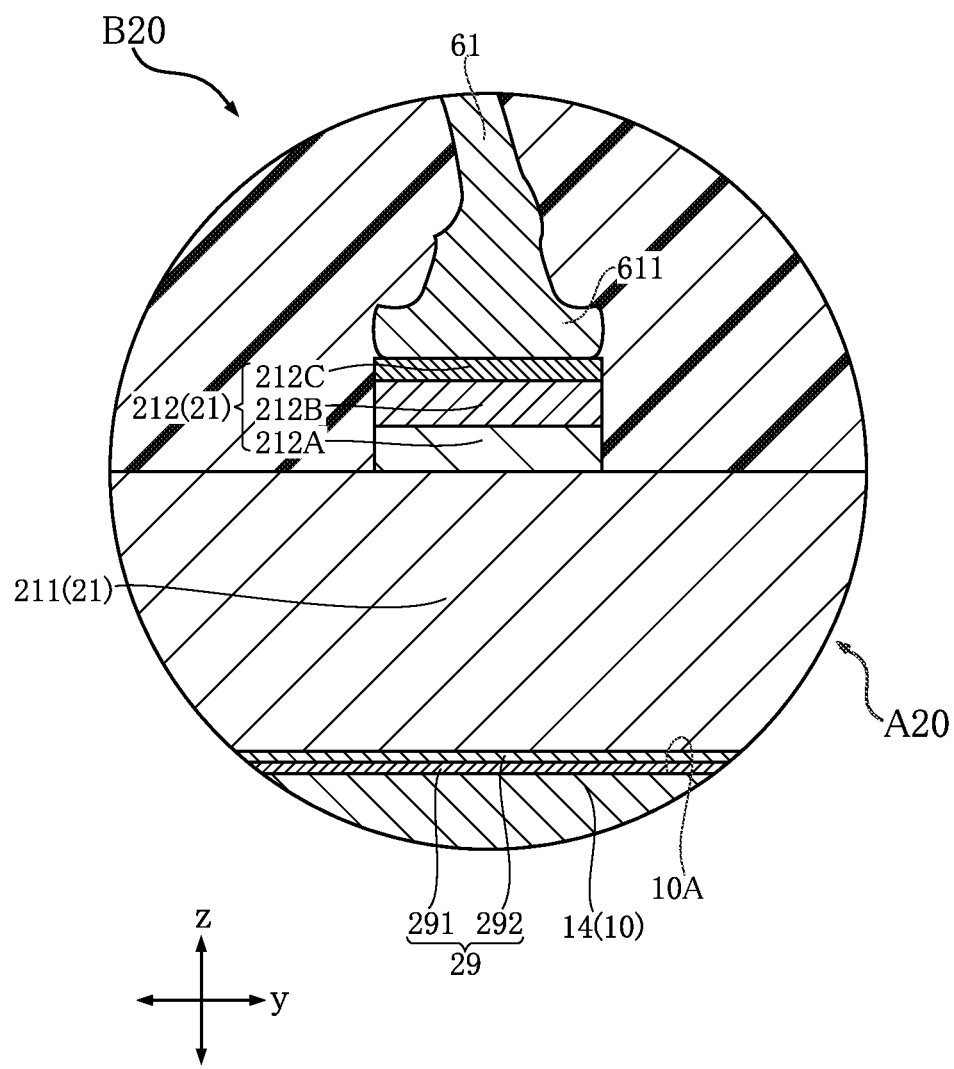
FIG. 31 is a partially enlarged cross-sectional view of the semiconductor element according to the second embodiment of the present disclosure.

Referring now to FIG. 30 and FIG. 31, a semiconductor element A20 according to a second embodiment of the present disclosure, and a semiconductor device B20 including the semiconductor element A20, will be described hereunder. In these drawings, the elements same as or similar to those of the semiconductor element A10 and the semiconductor device B10 are given the same numeral, and the description of such elements will not be repeated. Here, the position of the cross-section in FIG. 30 corresponds to the position of the cross-section in FIG. 4. The position of the cross-section in FIG. 31 corresponds to the position of the cross-section in FIG. 29.

<Semiconductor Element A20>

The semiconductor element A20 will be described, with reference to FIG. 30. The semiconductor element A20 is different from the semiconductor element A10, in the configuration of the plurality of second sections 212 of the obverse face electrode 21.

As shown in FIG. 30, the plurality of second sections 212 of the obverse face electrode 21 each include the first layer 212A, the second layer 212B, and a third layer 212C.

As shown in FIG. 30, the first layer 212A is formed on the first section 211 of the obverse face electrode 21 first section 211. The composition of the first layer 212A includes copper.

As shown in FIG. 30, the second layer 212B is formed on the first layer 212A. The composition of the second layer 212B includes a metal element. The metal element included in the composition of the second layer 212B is different from the metal element included in the composition of the first layer 212A, which is copper. The composition of the second layer 212B includes nickel.

As shown in FIG. 30, the third layer 212C is formed on the second layer 212B. The composition of the third layer 212C includes a metal element, different from both of the metal element included in the composition of the first layer 212A, which is copper, and the metal element included in the composition of the second layer 212B. The composition of the third layer 212C includes palladium. The composition of the third layer 212C may include gold, in place of palladium.

<Semiconductor Device B20>

The semiconductor device B20 will be described, with reference to FIG. 31. The semiconductor device B20 is formed by substituting the semiconductor element A10 mounted on the die pad 51 of the semiconductor device B10, with the semiconductor element A20 described above.

As shown in FIG. 31, in each of the plurality of first wires 61, the bonding portion 611 is connected to the third layer 212C of the second section 212 (obverse face electrode 21).

The semiconductor element A20 and the semiconductor device B20 provide the following advantageous effects.

In the semiconductor element A20, the obverse face electrode 21, electrically connected to the main body 10, includes the first section 211 located on the obverse face 10A of the main body 10, and the plurality of second sections 212 located in contact with the first section 211. The plurality of second sections 212 protrude from the first section 211, in the direction in which the obverse face 10A faces, in the thickness direction z. As viewed along the thickness direction z, the total area of the plurality of second sections 212 is smaller than the area of the first section 211, including the portion thereof overlapping with the plurality of second sections 212. Therefore, the semiconductor element A20 also presents improved heat dissipation performance, and can be prevented from being warped.

The semiconductor device B20 includes the semiconductor element A20, the die pad 51 on which the semiconductor element A20 is mounted, and the electrically conductive bonding layer 59 interposed between the die pad 51 and the reverse face electrode 22 of the semiconductor element A20. As described above, the semiconductor element A20 is prevented from being warped, and therefore the bonding strength of the semiconductor element A20 to the die pad 51 can also be prevented from being degraded. Further, the semiconductor device B20 includes the terminals 52 spaced apart from the die pad 51, and the wire connected between one of the plurality of second sections 212 of the obverse face electrode 21 of the semiconductor element A20 and the terminal 52 (one of the plurality of first wires 61). The composition of the wire includes copper. Therefore, in the semiconductor device B20 also, the heat dissipation performance of the semiconductor element A20 can be further improved.

In the semiconductor element A20, the plurality of second sections 212 of the obverse face electrode 21 each include the first layer 212A formed on the first section 211, the second layer 212B formed on the first layer 212A, and the third layer 212C formed on the second layer 212B. The composition of the first layer 212A includes copper. The metal element included in the composition of the second layer 212B is different from the metal element included in the composition of the first layer 212A. In other words, the metal element included in the composition of the second layer 212B is different from copper. The composition of the third layer 212C includes a metal element, different from both of the metal element included in the composition of the first layer 212A, and the metal element included in the composition of the second layer 212B. In other words, the metal element included in the composition of the third layer 212C is different from copper. Accordingly, in the semiconductor device B20, although the composition of each of the first section 211, the first layer 212A of the plurality of second sections 212, and the plurality of first wires 61 includes copper, one of the plurality of first wires 61 can be securely connected to one of the plurality of second sections 212, by wire bonding. From such a viewpoint, it is preferable that the composition of the second layer 212B includes nickel, and the composition of the third layer 212C includes palladium.

Third Embodiment

Figure 32:
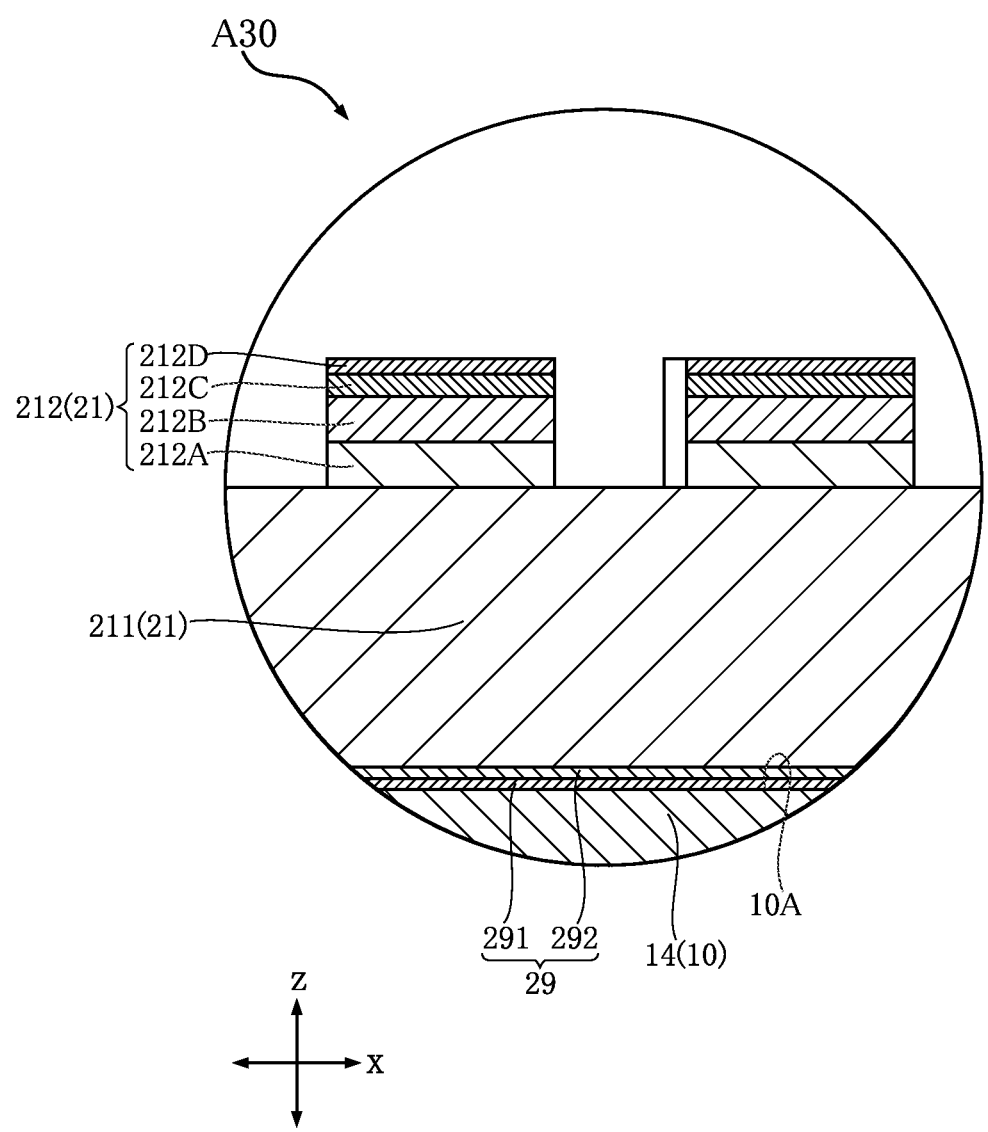
FIG. 32 is a partially enlarged cross-sectional view of a semiconductor element according to a third embodiment of the present disclosure.
Figure 33:
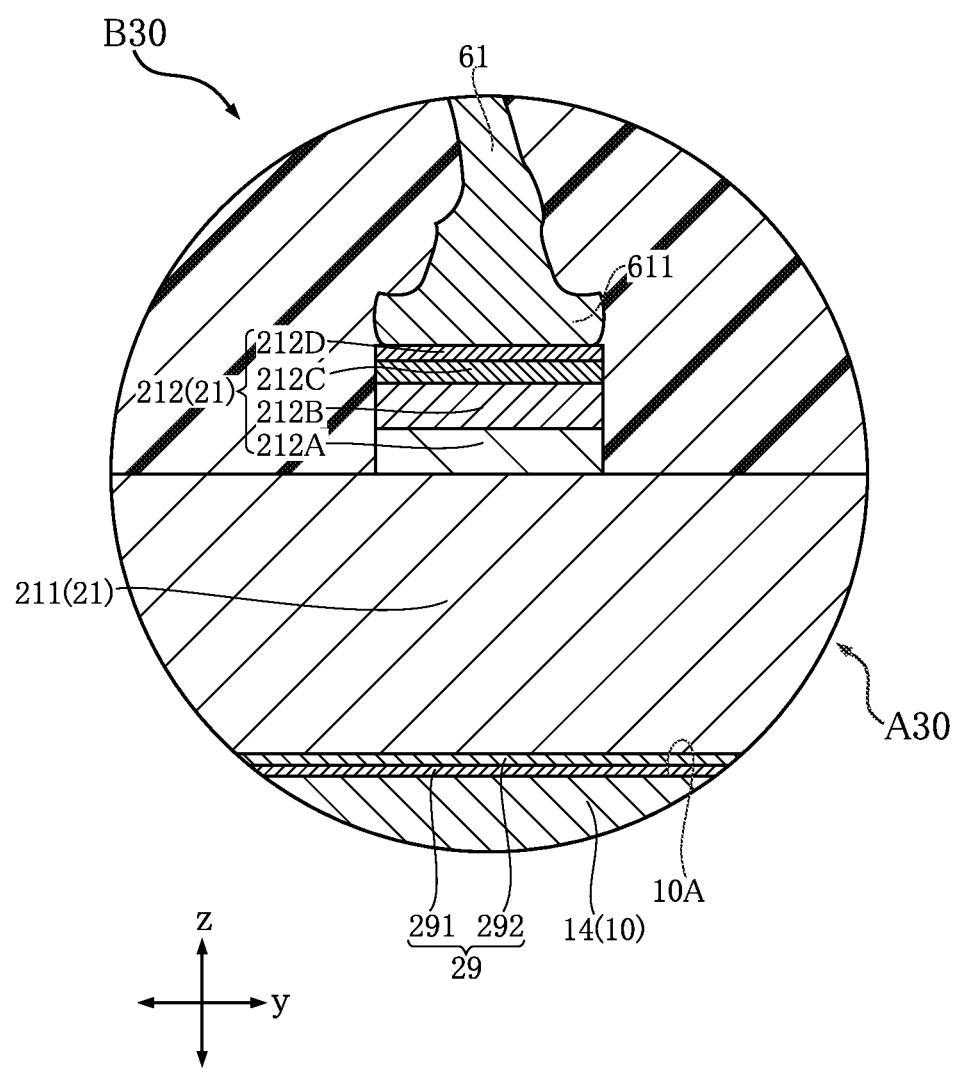
FIG. 33 is a partially enlarged cross-sectional view of the semiconductor element according to the third embodiment of the present disclosure.
Figure 34:
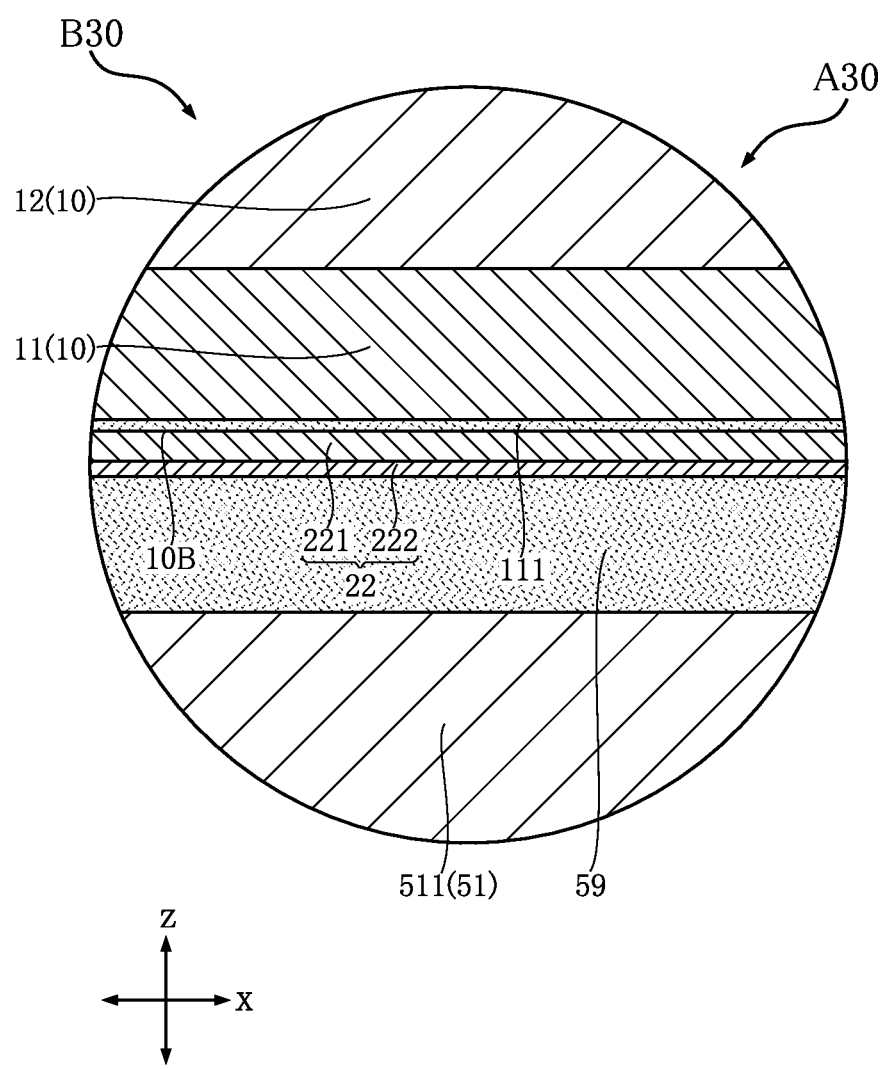
FIG. 34 is a partially enlarged cross-sectional view of the semiconductor device shown in FIG. 33.

Referring to FIG. 32 to FIG. 34, a semiconductor element A30 according to a third embodiment of the present disclosure, and a semiconductor device B30 including the semiconductor element A30, will be described hereunder. In these drawings, the elements same as or similar to those of the semiconductor element A10 and the semiconductor device B10 are given the same numeral, and the description of such elements will not be repeated. Here, the position of the cross-section in FIG. 32 corresponds to the position of the cross-section in FIG. 4. The position of the cross-section in FIG. 33 corresponds to the position of the cross-section in FIG. 29. The position of the cross-section in FIG. 34 in the unenlarged state corresponds to the position of the cross-section in FIG. 28.

<Semiconductor Element A30>

The semiconductor element A30 will be described, with reference to FIG. 32. The semiconductor element A30 is different from the semiconductor element A10, in the configuration of the plurality of second sections 212 of the obverse face electrode 21.

As shown in FIG. 32, the plurality of second sections 212 of the obverse face electrode 21 each include the first layer 212A, the second layer 212B, the third layer 212C, and a fourth layer 212D.

As shown in FIG. 32, the first layer 212A is formed on the first section 211 of the obverse face electrode 21. The composition of the first layer 212A includes copper.

As shown in FIG. 32, the second layer 212B is formed on the first layer 212A. The composition of the second layer 212B includes a metal element. The metal element included in the composition of the second layer 212B is different from the metal element included in the composition of the first layer 212A, which is copper. The composition of the second layer 212B includes nickel.

As shown in FIG. 32, the third layer 212C is formed on the second layer 212B. The composition of the third layer 212C includes a metal element, different from both of the metal element included in the composition of the first layer 212A, which is copper, and the metal element included in the composition of the second layer 212B. The composition of the third layer 212C includes palladium.

As shown in FIG. 32, the fourth layer 212D is formed on the third layer 212C. The composition of the fourth layer 212D includes a metal element, different from all of the metal element included in the composition of the first layer 212A, which is copper, the metal element included in the composition of the second layer 212B, and the metal element included in the composition of the third layer 212C. The composition of the fourth layer 212D includes gold.

<Semiconductor Device B30>

The semiconductor device B30 will be described, with reference to FIG. 33 and FIG. 34. The semiconductor device B30 is formed by substituting the semiconductor element A10 mounted on the die pad 51 of the semiconductor device B10, with the semiconductor element A30 described above. Further, the semiconductor device B30 is different from the semiconductor device B10, in the configuration of the bonding layer 59.

As shown in FIG. 33, in each of the plurality of first wires 61, the bonding portion 611 is connected to the fourth layer 212D of the second section 212 (obverse face electrode 21).

In the semiconductor element A30, the bonding layer 59 shown in FIG. 34 includes a sintered body of silver. The composition of the bonding layer 59 does not include tin.

The semiconductor element A30 and the semiconductor device B30 provide the following advantageous effects.

In the semiconductor element A30, the obverse face electrode 21, electrically connected to the main body 10, includes the first section 211 located on the obverse face 10A of the main body 10, and the plurality of second sections 212 located in contact with the first section 211. The plurality of second sections 212 protrude from the first section 211, in the direction in which the obverse face 10A faces, in the thickness direction z. As viewed along the thickness direction z, the total area of the plurality of second sections 212 is smaller than the area of the first section 211, including the portion thereof overlapping with the plurality of second sections 212. Therefore, the semiconductor element A30 also presents improved heat dissipation performance, and can be prevented from being warped.

The semiconductor device B30 includes the semiconductor element A30, the die pad 51 on which the semiconductor element A30 is mounted, and the electrically conductive bonding layer 59 interposed between the die pad 51 and the reverse face electrode 22 of the semiconductor element A30. As described above, the semiconductor element A30 is prevented from being warped, and therefore the bonding strength of the semiconductor element A30 to the die pad 51 can also be prevented from being degraded. Further, the semiconductor device B30 includes the terminals 52 spaced apart from the die pad 51, and the wire connected between one of the plurality of second sections 212 of the obverse face electrode 21 of the semiconductor element A30 and the terminal 52 (one of the plurality of first wires 61). The composition of the wire includes copper. Therefore, in the semiconductor device B30 also, the heat dissipation performance of the semiconductor element A30 can be further improved.

In the semiconductor element A30, the plurality of second sections 212 of the obverse face electrode 21 each include the first layer 212A formed on the first section 211, the second layer 212B formed on the first layer 212A, the third layer 212C formed on the second layer 212B, and the fourth layer 212D formed on the third layer 212C. The composition of the first layer 212A includes copper. The metal element included in the composition of the second layer 212B is different from the metal element included in the composition of the first layer 212A. In other words, the metal element included in the composition of the second layer 212B is different from copper. The composition of the third layer 212C includes a metal element, different from both of the metal element included in the composition of the first layer 212A, and the metal element included in the composition of the second layer 212B. In other words, the metal element included in the composition of the third layer 212C is different from copper. The composition of the fourth layer 212D includes a metal element, different from all of the metal element included in the composition of the first layer 212A, the metal element included in the composition of the second layer 212B, and the metal element included in the composition of the third layer 212C. In other words, the metal element included in the composition of the fourth layer 212D is different from copper. Accordingly, in the semiconductor device B30, although the composition of each of the first section 211, the first layer 212A of the plurality of second sections 212, and the plurality of first wires 61 includes copper, one of the plurality of first wires 61 can be securely connected to one of the plurality of second sections 212, by wire bonding. From such a viewpoint, it is preferable that the composition of the second layer 212B includes nickel, and the composition of the third layer 212C includes palladium.

Further, it is preferable that the composition of the fourth layer 212D includes gold. When the silicide layer 111 is formed on the main body 10 (semiconductor substrate 11) by heat treatment, in the manufacturing process of the reverse face electrode 22 of the semiconductor element A10 shown in FIG. 18 and FIG. 19, the metal element included in the composition of the second layer 212B, which is nickel, may be diffused to the third layer 212C, in each of the plurality of second sections 212. In the situation illustrated in FIG. 31, when one of the plurality of first wires 61 is connected by wire bonding to the third layer 212C, to which nickel is diffused, the bonding portion 611 may be imperfectly connected to one of the plurality of second sections 212 corresponding to the mentioned third layer 212C. However, when one of the plurality of first wires 61 is connected to the fourth layer 212D by wire bonding, as shown in FIG. 33, the bonding portion 611 can be prevented from being imperfectly connected to one of the plurality of second sections 212 corresponding to the mentioned fourth layer 212D. This is because, since the composition of the fourth layer 212D includes gold, the nickel diffused to the third layer 212C is suppressed from being further diffused to the fourth layer 212D.

The present disclosure is not limited to the foregoing embodiments. The specific configuration of the elements of the semiconductor device according to the present disclosure may be modified in various manners.

Various embodiments of the present disclosure may be defined as in the following appendices.

Appendix 1. A semiconductor element comprising:
a main body including an obverse face that faces in a thickness direction; and
an obverse face electrode electrically connected to the main body,
wherein the obverse face electrode includes a first section provided on the obverse face and a plurality of second sections located in contact with the first section and spaced apart from each other in a direction perpendicular to the thickness direction, and
a total area of the plurality of second sections is smaller than an area of the first section including portions overlapping with the plurality of second sections in a view along the thickness direction.

Appendix 2. The semiconductor element according to appendix 1, wherein a composition of the first section includes copper.

Appendix 3. The semiconductor element according to appendix 2, further comprising an underlying layer interposed between the obverse face and the first section,
wherein the underlying layer includes a barrier layer located in contact with the obverse face, and a seed layer interposed between the barrier layer and the first section, and
a composition of the seed layer is the same as the composition of the first section.

Appendix 4. The semiconductor element according to appendix 2 or 3, wherein, as viewed along the thickness direction, a ratio of the total area of the plurality of second sections, to the area of the first section including portions overlapping with the plurality of second sections, is not smaller than 20% and not greater than 50%.

Appendix 5. The semiconductor element according to appendix 4, wherein, as viewed in the thickness direction, a ratio of an area of the obverse face electrode to an area of the obverse face is not smaller than 50% and not greater than 90%.

Appendix 6. The semiconductor element according to any one of appendices 2 to 5, wherein the main body is provided with a switching circuit and a control circuit electrically connected to the switching circuit, and
the obverse face electrode overlaps with the switching circuit, as viewed along the thickness direction.

Appendix 7. The semiconductor element according to appendix 6, further comprising an input electrode provided on the obverse face and electrically connected to the control circuit,
wherein the input electrode is spaced apart from the obverse face electrode.

Appendix 8. The semiconductor element according to any one of appendices 1 to 7, wherein the plurality of second sections each include a first layer formed on the first section, and a second layer formed on the first layer,
a composition of each of the first layer and the second layer includes a metal element, and
the metal element included in the composition of the second layer is different from the metal element included in the composition of the first layer.

Appendix 9. The semiconductor element according to appendix 8, wherein a composition of the first layer includes nickel.

Appendix 10. The semiconductor element according to appendix 9, wherein a composition of the second layer includes palladium.

Appendix 11. The semiconductor element according to appendix 8, wherein the plurality of second sections each include a third layer formed on the second layer, the composition of the first layer includes copper, and a composition of the third layer includes a metal element different from both of the metal element included in the composition of the first layer, and the metal element included in the composition of the second layer.

Appendix 12. The semiconductor element according to appendix 11, wherein a composition of the second layer includes nickel.

Appendix 13. The semiconductor element according to appendix 12, wherein a composition of the third layer includes palladium.

Appendix 14. The semiconductor element according to any one of appendices 11 to 13, wherein the plurality of second sections each include a fourth layer formed on the third layer, and a composition of the fourth layer includes a metal element different from the metal element included in the composition of the first layer, the metal element included in the composition of the second layer, and the metal element included in the composition of the third layer.

Appendix 15. The semiconductor element according to appendix 14, wherein a composition of the fourth layer includes gold.

Appendix 16. The semiconductor element according to any one of appendices 1 to 15, wherein the main body includes a reverse face opposite to the obverse face, the semiconductor element further comprising a reverse face electrode provided on the reverse face and electrically connected to the main body, the main body is formed with a silicide layer including the reverse face and located in contact with the reverse face electrode, and a composition of the silicide layer includes silicon and a metal element other than silicon.

Appendix 17. The semiconductor element according to appendix 16, wherein a composition of the silicide layer includes silicon and nickel.

Appendix 18. A semiconductor device comprising:

a semiconductor element according to appendix 16 or 17;

a die pad on which the semiconductor element is mounted;

a bonding layer interposed between the die pad and the reverse face electrode, the bonding layer being electrically conductive;

a terminal spaced apart from the die pad; and a wire connected to one of the plurality of second sections and to the terminal, wherein a composition of the wire includes copper.

Appendix 19. The semiconductor device according to appendix 18, wherein the bonding layer includes sintered silver.

Appendix 20. The semiconductor device according to appendix 18 or 19, further comprising a sealing resin covering the semiconductor element and the wire, wherein a part of the die pad is exposed from the sealing resin.

The invention claimed is:

1. A semiconductor element comprising:

a main body including an obverse face that faces in a thickness direction; and an obverse face electrode electrically connected to the main body, wherein the obverse face electrode includes a first section provided on the obverse face and a plurality of second sections located in contact with the first section and spaced apart from each other in a direction perpendicular to the thickness direction, a total area of the plurality of second sections is smaller than an area of the first section including portions overlapping with the plurality of second sections in a view along the thickness direction, the plurality of second sections include: a first group of second sections arranged in a first row extending in a first direction perpendicular to the thickness direction; and a second group of second sections arranged in a second row extending in the first direction, and at least one of the second sections of the first group comprises a portion thereof that does not overlap with any one of the second sections of the second group as viewed in a second direction perpendicular to the thickness direction and the first direction.

2. The semiconductor element according to claim 1, wherein a composition of the first section includes copper.

3. The semiconductor element according to claim 2, further comprising an underlying layer interposed between the obverse face and the first section, wherein the underlying layer includes a barrier layer located in contact with the obverse face, and a seed layer interposed between the barrier layer and the first section, and a composition of the seed layer is the same as the composition of the first section.

4. The semiconductor element according to claim 2, wherein, as viewed along the thickness direction, a ratio of the total area of the plurality of second sections, to the area of the first section including portions overlapping with the plurality of second sections, is not smaller than 20% and not greater than 50%.

5. The semiconductor element according to claim 4, wherein, as viewed in the thickness direction, a ratio of an area of the obverse face electrode to an area of the obverse face is not smaller than 50% and not greater than 90%.

6. The semiconductor element according to claim 2, wherein the main body is provided with a switching circuit and a control circuit electrically connected to the switching circuit, and the obverse face electrode overlaps with the switching circuit, as viewed along the thickness direction.

7. The semiconductor element according to claim 6, further comprising an input electrode provided on the obverse face and electrically connected to the control circuit, wherein the input electrode is spaced apart from the obverse face electrode.

8. The semiconductor element according to claim 1, wherein the plurality of second sections each include a first layer formed on the first section, and a second layer formed on the first layer, a composition of each of the first layer and the second layer includes a metal element, and the metal element included in the composition of the second layer is different from the metal element included in the composition of the first layer.

9. The semiconductor element according to claim 8, wherein a composition of the first layer includes nickel.

10. The semiconductor element according to claim 9, wherein a composition of the second layer includes palladium.

11. The semiconductor element according to claim 8, wherein the plurality of second sections each include a third layer formed on the second layer,
the composition of the first layer includes copper, and
a composition of the third layer includes a metal element different from both of the metal element included in the composition of the first layer, and the metal element included in the composition of the second layer.

12. The semiconductor element according to claim 11, wherein a composition of the second layer includes nickel.

13. The semiconductor element according to claim 12, wherein a composition of the third layer includes palladium.

14. The semiconductor element according to claim 11, wherein the plurality of second sections each include a fourth layer formed on the third layer, and
a composition of the fourth layer includes a metal element different from the metal element included in the composition of the first layer, the metal element included in the composition of the second layer, and the metal element included in the composition of the third layer.

15. The semiconductor element according to claim 14, wherein a composition of the fourth layer includes gold.

16. The semiconductor element according to claim 1, wherein the main body includes a reverse face opposite to the obverse face,
the semiconductor element further comprising a reverse face electrode provided on the reverse face and electrically connected to the main body,
the main body is formed with a silicide layer including the reverse face and located in contact with the reverse face electrode, and
a composition of the silicide layer includes silicon and a metal element other than silicon.

17. The semiconductor element according to claim 16, wherein a composition of the silicide layer includes silicon and nickel.

18. A semiconductor device comprising:
a semiconductor element according to claim 16;
a die pad on which the semiconductor element is mounted;
a bonding layer interposed between the die pad and the reverse face electrode, the bonding layer being electrically conductive;
a terminal spaced apart from the die pad; and
a wire connected to one of the plurality of second sections and to the terminal,
wherein a composition of the wire includes copper.

19. The semiconductor device according to claim 18, wherein the bonding layer includes sintered silver.

20. The semiconductor device according to claim 18, further comprising a sealing resin covering the semiconductor element and the wire,
wherein a part of the die pad is exposed from the sealing resin.

* * * * *